US011774524B2

(12) United States Patent
Kubota

(10) Patent No.: US 11,774,524 B2
(45) Date of Patent: Oct. 3, 2023

(54) MAGNETIC SENSOR, MAGNETIC SENSOR ARRAY, MAGNETIC FIELD DISTRIBUTION MEASUREMENT DEVICE, AND POSITION IDENTIFICATION DEVICE

(71) Applicant: Murata Manufacturing Co., Ltd., Nagaokakyo (JP)

(72) Inventor: Masashi Kubota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 286 days.

(21) Appl. No.: 17/469,988

(22) Filed: Sep. 9, 2021

(65) Prior Publication Data

US 2021/0405132 A1  Dec. 30, 2021

Related U.S. Application Data

(63) Continuation of application No. PCT/JP2020/006210, filed on Feb. 18, 2020.

(30) Foreign Application Priority Data

Jun. 11, 2019  (JP) .................................. 2019-108730

(51) Int. Cl.
G01R 33/02 (2006.01)
G01R 33/09 (2006.01)
(Continued)

(52) U.S. Cl.
CPC .............. *G01R 33/091* (2013.01); *G01B 7/30* (2013.01); *G01R 33/09* (2013.01); *G01R 33/093* (2013.01);
(Continued)

(58) Field of Classification Search
CPC .. G01R 33/091; G01R 33/093; G01R 33/098; G01R 33/0052; G01R 33/0094;
(Continued)

(56) References Cited

U.S. PATENT DOCUMENTS 5,561,368 A  10/1996  Dovek et al.
2002/0142490 A1  10/2002  Sato et al.
(Continued)

FOREIGN PATENT DOCUMENTS

JP  08-226960 A  9/1996
JP  2002-299728 A  10/2002
(Continued)

OTHER PUBLICATIONS

Official Communication issued in International Patent Application No. PCT/JP2020/006210, dated May 19, 2020.
(Continued)

*Primary Examiner* — Raul J Rios Russo
(74) *Attorney, Agent, or Firm* — KEATING & BENNETT, LLP

(57) ABSTRACT

A magnetic sensor includes an angle sensor including first magnetoresistive elements and producing an output based on an angle between a direction of an external magnetic field and a reference direction, and a magnetic field strength sensor including second magnetoresistive elements and producing an output based on a strength of the external magnetic field. The angle sensor and the magnetic field strength sensor have a same or substantially a same direction of normal to a reference surface for sensor formation. The magnetic field strength sensor has different output characteristics in accordance with the angle between the direction of the external magnetic field and the reference direction. Based on the angle between the direction of the external magnetic field and the reference direction detected by the angle sensor and the output from the magnetic field strength sensor, the strength of the external magnetic field is determined.

20 Claims, 20 Drawing Sheets

(51) Int. Cl.
  *G01B 7/30* (2006.01)
  *B82Y 25/00* (2011.01)
  *B82Y 10/00* (2011.01)
  *B82Y 40/00* (2011.01)

(52) U.S. Cl.
  CPC ............ *G01R 33/098* (2013.01); *B82Y 10/00* (2013.01); *B82Y 25/00* (2013.01); *B82Y 40/00* (2013.01)

(58) Field of Classification Search
  CPC .......... G01R 33/09; G01B 7/30; H10N 50/10; G01D 5/145; B82Y 25/00; B82Y 10/00; B82Y 40/00
  USPC ............ 324/51, 55, 200, 227, 228, 244, 252
  See application file for complete search history.

(56) References Cited

U.S. PATENT DOCUMENTS

| | | | |
|---|---|---|---|
| 2008/0180865 | A1 | 7/2008 | Min et al. |
| 2009/0027048 | A1 | 1/2009 | Sato et al. |
| 2015/0185297 | A1 | 7/2015 | Zimmer et al. |
| 2016/0356865 | A1* | 12/2016 | Ide .................. H10N 50/85 |
| 2017/0168122 | A1 | 6/2017 | Raberg et al. |
| 2018/0164127 | A1 | 6/2018 | Anagawa et al. |
| 2018/0164387 | A1 | 6/2018 | Raberg |
| 2020/0209326 | A1* | 7/2020 | Watanabe .......... G01R 33/0011 |

FOREIGN PATENT DOCUMENTS

| | | |
|---|---|---|
| JP | 2006-308573 A | 11/2006 |
| JP | 2011-059103 A | 3/2011 |
| JP | 2012-110470 A | 6/2012 |
| JP | 2013-064666 A | 4/2013 |
| JP | 2013-120080 A | 6/2013 |
| JP | 2016-058609 A | 4/2016 |
| JP | 2017-003345 A | 1/2017 |
| JP | 2017-112375 A | 6/2017 |
| JP | 2018-096966 A | 6/2018 |

OTHER PUBLICATIONS

Zhu et al., "Magnetic tunnel junctions", Materialstoday, vol. 9, No. 11, Nov. 2006, pp. 36-45.
Schneider et al., "Lorentz microscopy of circular ferromagnetic permalloy nanodisks", Applied Physics Letters, vol. 77, No. 18, Oct. 30, 2000, pp. 2909-2911.
Ando, Development of bio-magnetic field sensor with TMR devices., Department of Applied Physics, Nov. 27, 2017, pp. 1-9.
Antos et al., "Magnetic Vortex Dynamics", Journal of the Physical Society of Japan, vol. 77, No. 3, Mar. 2008, pp. 031004-1-031004-8.
Ando et al., "Magnetic tunnel junction sensor applying magnetic vortex state", 10pE-12, 2015, pp. 277-282.
Wurft et al., "The Influence of Edge Inhomogeneities on Vortex Hysteresis Curve in Magnetic Tunnel Junctions", IEEE Transactions on Magnetics, vol. 53, No. 11, Nov. 2017, pp. 1-5.

* cited by examiner

MAGNETIC SENSOR, MAGNETIC SENSOR ARRAY, MAGNETIC FIELD DISTRIBUTION MEASUREMENT DEVICE, AND POSITION IDENTIFICATION DEVICE

CROSS REFERENCE TO RELATED APPLICATIONS

This application claims the benefit of priority to Japanese Patent Application No. 2019-108730 filed on Jun. 11, 2019 and is a Continuation Application of PCT Application No. PCT/JP2020/006210 filed on Feb. 18, 2020. The entire contents of each application are hereby incorporated herein by reference.

BACKGROUND OF THE INVENTION

1. Field of the Invention

The present disclosure relates to a magnetic sensor, a magnetic sensor array, a magnetic field distribution measurement device, and a position identification device including magnetoresistance effect elements.

2. Description of the Related Art

As a conventional angle sensor using a magnetic tunnel junction element (magnetoresistive element), a first angle sensor 400 as shown in FIG. 26 has been known. FIG. 26 is a schematic view showing a conventional first angle sensor.

As shown in FIG. 26, the first angle sensor 400 includes a magnetic tunnel junction element 401. The magnetic tunnel junction element 401 includes a reference layer 402 with its magnetization direction fixed, an insulating layer 403, and a free layer 404 with its magnetization direction not fixed. For example, by rotation of a magnetic field source such as a magnet, the orientation of magnetization of the free layer 404 is changed. That is, by an angle between the direction of an external magnetic field and a predetermined reference direction (angle of the external magnetic field), the orientation of magnetization of the free layer 404 is changed.

FIG. 27 is a diagram showing changes in resistance of the magnetic tunnel junction element in the conventional first angle sensor. As shown in FIG. 27, by a relative angle of magnetization between the free layer 404 and the reference layer 402, the resistance of the first angle sensor 400 is changed.

FIG. 28 is a diagram showing output characteristics of the conventional first angle sensor. With the change of the resistance of the first angle sensor 400, the output characteristics of the first angle sensor 400 with respect to the angle of the external magnetic field are represented by a cosine function.

For example, at 0° and 180°, outputs from the first angle sensor 400 have the same value. In the first angle sensor 400, it is difficult to uniquely determine the angle of the external magnetic field.

Thus, as a structure for uniquely determining the angle of the external magnetic field, a second angle sensor 400A as shown in FIG. 29 has been known. FIG. 29 is a schematic plan view showing a conventional second angle sensor.

As shown in FIG. 29, the second angle sensor 400A includes a first sensor 410 and a second sensor 420. The first sensor 410 includes a bridge circuit including magnetic tunnel junction elements 401A, 401B, 401C, and 401D. The second sensor 420 includes a bridge circuit including magnetic tunnel junction elements 401E, 401F, 401G, and 401H.

The magnetic tunnel junction elements 401A to 401H have a structure substantially similar to that of the above-described magnetic tunnel junction element 401, but the orientation (AR2) of magnetization of the reference layer is partially different.

Specifically, in the second sensor, the orientation (AR2) of magnetization of the reference layer of the magnetic tunnel junction elements 401E to 401H corresponding to the magnetic tunnel junction elements 401A to 401D is different by 90° from the orientation (AR2) of magnetization of the reference layer of the magnetic tunnel junction elements 401A to 401D.

FIG. 30 is a diagram showing output characteristics of the conventional second angle sensor. If configuration is as described above, as shown in FIG. 30, the phase of the output characteristics of the second sensor 420 is shifted by 90° with respect to the phase of the output characteristics of the first sensor.

By using two outputs from the first sensor 410 and the second sensor 420 as described above, the angle of the external magnetic field can be uniquely determined.

Note that as methods for fixing the orientation of magnetization of the reference layer for each magnetic tunnel junction element, methods are disclosed in, for example, Japanese Unexamined Patent Application Publication No. 8-226960, Japanese Unexamined Patent Application Publication No. 2002-299728, and Japanese Unexamined Patent Application Publication No. 2013-64666.

In Japanese Unexamined Patent Application Publication No. 8-226960, a method is disclosed in which a lead wire for energization is provided near the magnetic tunnel junction element and, with a magnetic field generated by energization, annealing is performed to form exchange coupling to fix the reference layer. According to this method, by providing a geometrical arrangement of the magnetic tunnel junction element and the lead wire for energization, the reference layer can be fixed to a desired direction.

In Japanese Unexamined Patent Application Publication No. 2002-299728, as a method of fixing the reference layer to a desired direction, a method is disclosed in which with a magnetic field generated by using a magnet array, annealing is performed to provide exchange coupling.

In Japanese Unexamined Patent Application Publication No. 2013-64666, as a method of fixing the reference layer to a desired direction, a method is disclosed in which with a magnetic field being applied, annealing is performed by laser light application to form exchange coupling.

Here, as a design idea for achieving high accuracy of a detected angle, it is demanded that unintended magnetic anisotropy is eliminated as much as possible in the angle sensor so that the magnetization direction of the free layer follows the detection magnetic field direction. This leads to the use of the magnetic tunnel junction element in a magnetic saturation area. Thus, the design idea of the angle sensor (high accuracy of the detected angle and reduction in magnetic anisotropy) is contrary to the general design idea of the linear sensor (expansion of the input magnetic field range and increase in magnetic anisotropy). Therefore, it is difficult to detect the strength of the external magnetic field with high accuracy by using only the angle sensor.

In J. Zhu and C. Park, "Magnetic Tunnel Junctions", Materials Today 9, 36 (2006), it is disclosed that, in a conventional magnetic tunnel junction element, a tunnel magnetoresistance ratio (TMR ratio) indicating the tunnel magnetoresistance (TMR) effect is determined by, as shown in FIG. 31, a relative angle between magnetization M1 of a free layer and magnetization M2 of a reference layer, these layers being arranged so as to interpose an insulating layer therebetween.

FIG. 31 is a schematic view showing the orientations of magnetization M1 of a free layer and magnetization M2 of a reference layer, these layers being arranged so as to interpose an insulating layer therebetween in a conventional magnetic tunnel junction element.

In FIG. 31, there is disclosed a magnetoresistive element 500 including a multilayer portion 501 with a reference layer 502, a barrier layer 503, and a free layer 504 sequentially laminated. A relative angle between the magnetization M1 of the free layer 504 and the magnetization M2 of the reference layer 502 is θ.

A conductance by the tunnel magnetoresistance (TMR) effect is represented by Equation (1a) below by using the relative angle θ of magnetization between the ferromagnetic body layers on an upper side (M1) and a lower side (M2) of the barrier layer.

$$G(\theta) = \tfrac{1}{2}(G_P + G_{AP}) + \tfrac{1}{2}(G_P - G_{AP})\cos\theta \qquad \text{Equation (1a)}$$

Here, $G_P =)G(0°$ means that the magnetization M1 and the magnetization M2 are parallel and $G_{AP} =)G(180°$ means that the magnetization M1 and the magnetization M2 are antiparallel. The TMR ratio is represented by Equation (2a) of the Julliere's model below.

$$\text{TMR ratio} = \frac{G_P - G_{AP}}{G_{AP}} = \frac{R_{AP} - R_P}{R_P} = \frac{2P_1 P_2}{1 - P_1 P_2} \qquad \text{Equation (2a)}$$

Here, $R_p$ is a tunnel resistance when the magnetization M1 and the magnetization M2 are parallel, and $R_{AP}$ is a tunnel resistance when the magnetization M1 and the magnetization M2 are antiparallel. P1 and P2 are spin polarizations of the reference layer 202 and the free layer 204, respectively.

FIG. 32 is a diagram showing conventional various magnetic tunnel junction elements and linearity control methods at these magnetic tunnel junction elements and their features.

In Yasuo Ando, "Development of Bio-Magnetic Sensor Using TMR", The 5th IWASAKI Conference "Magnetic Sensor and its Utilization Leading to Improvement in Infrastructure", Nov. 27, 2017, as shown in FIG. 32, linearity control schemes with various magnetic tunnel junction elements and their features are described. To control linearity, the anisotropic magnetic field is applied to the free layer to a direction orthogonal to the detection magnetic field direction.

In FIG. 32, three types of magnetic tunnel junction elements are disclosed sequentially from the left. In the first magnetic tunnel junction element from the left, the magnetization of the reference layer is oriented in an in-plane direction parallel to the film surface, and the magnetization of the free layer is also oriented in the in-plane direction. The external magnetic field to be detected changes in a direction parallel to the film surface of the reference layer. In this structure, to apply magnetic anisotropy to the free layer, shape anisotropy or bias magnetic field application by a magnet or electromagnet is required. Also, if the direction of the anisotropic magnetic field and the direction of the detection magnetic field are shifted from 90°, linearity of sensor outputs is degraded.

In the second magnetic tunnel junction element from the left, the magnetization of the reference layer is oriented in an in-plane direction parallel to the film surface, and the magnetization of the free layer is oriented in a direction perpendicular to the film surface of the reference layer. The external magnetic field to be detected changes in a direction parallel to the film surface of the reference layer. In this structure, to apply magnetic anisotropy to the free layer, interfacial interaction of the free layer/tunnel barrier is used, and thus design flexibility is low and a tradeoff between sensitivity and the detection magnetic field range is large.

In the third magnetic tunnel junction element from the left, the magnetization of the reference layer is oriented in a direction perpendicular to the film surface. The magnetization of the free layer is oriented in an in-plane direction parallel to the film surface of the reference layer. The external magnetic field to be detected changes in a direction perpendicular to the film surface of the reference layer. In this structure, since the detection magnetic field direction is a direction perpendicular to the film surface, this structure is not suitable for integration of an element which simultaneously detects an angle and a magnetic field strength.

In the first structure, to apply an anisotropic magnetic field, shape anisotropy or a magnet or electromagnet is required, or interaction on the multilayer interface is required. Thus, there are problems in which a tradeoff between sensitivity and the detection magnetic field range is large and design flexibility is low.

As a magnetoresistive element capable of improving the problems described above, a magnetoresistive element having a magnetic vortex structure as described below has been developed.

In R. Antos, Y. Otani and J. Shibata, "Magnetic Vortex Dynamics", J. Phys. Soc. Jpn. 77, 031004 (2008), as shown in FIG. 33, a magnetic vortex structure is disclosed as a phenomenon of making a special response to a magnetic field.

FIG. 33 is a diagram showing a hysteresis loop in a conventional magnetoresistive element having a magnetic vortex structure. As shown in FIG. 33, in a hysteresis loop in the magnetoresistive element having the magnetic vortex structure, a linear area appears on a portion of a magnetization curve.

In M. Schneider, H. Hoffmann and J. Zweck, "Lorentz Microscopy of Circular Ferromagnetic Permalloy Nanodisks", Appl. Phys. Lett. 77, 2909 (2000), as shown in FIG. 33, there are disclosed a magnetic structure of a magnetoresistive element having a magnetic vortex structure and a relationship between a saturation field and a nucleation field.

FIG. 34 is a diagram showing the disk diameter of the conventional magnetoresistive element having the magnetic vortex structure, and a saturation field and a nucleation field. As shown in FIG. 34, in the magnetoresistive element having the magnetic vortex structure, as the disk aspect ratio (=the film thickness of the free layer/disk diameter) increases, the saturation field and the nucleation field increase. That is, as the disk aspect ratio increases, the linear area of the magnetoresistive element having the magnetic vortex structure expands.

As shown in FIG. 35 to FIG. 37, in U.S. Patent Application Publication No. 2008/0180865, a design is suggested in which a magnetic vortex structure is used in a giant magnetoresistive (GMR) or tunnel magnetoresistive (TMR) sensor to obtain odd-function-type linear input magnetic field-resistance characteristics.

FIG. 35 is a schematic sectional view showing a magnetic sensor including incorporated therein the conventional magnetoresistive element having the magnetic vortex structure. FIG. 36 is a schematic top view of the magnetic sensor of FIG. 35. FIG. 37 is a diagram showing responsiveness of the magnetic sensor shown in FIG. 35.

As shown in FIG. 35 and FIG. 36, U.S. Patent Application Publication No. 2008/0180865 discloses a structure in which a magnetoresistive element 301 including a multilayer portion with a reference layer 302, a barrier layer 303, and a free layer 304 having a magnetic vortex structure sequentially laminated is interposed between a lower shield 310 and an upper shield 320 which are made of a magnetically-permeable material. In the reference layer 302, magnetization is fixed in an in-plane direction. In the free layer 304, magnetization is vortical.

As shown in FIG. 37, the current flowing on the film surface of the reference layer 302 in a vertical direction substantially linearly changes with respect to changes in magnetic field.

Similarly, magnetoresistive elements having a magnetic vortex structure are disclosed also in U.S. Patent Application Publication No. 2015/0185297; Motoki Endo, Mikihiko Oogane, Hiroshi Naganuma, and Yasuo Ando, "Magnetic Tunnel Junction Sensor Applying Magnetic Vortex State", Digests of the 39th Annual Conference on Magnetics in Japan 2015, 10pE-12, 277 (2015); and T. Wurft, W. Raberg, K. Prugl, A. Satz, G. Reiss and H. Bruckl, "The Influence of Edge Inhomogeneities on Vortex Hysteresis Curves in Magnetic Tunnel Junctions", IEEE Transactions on Magnetics AF-05, (2017).

In Japanese Unexamined Patent Application Publication No. 2012-110470, a technology is disclosed in which TMR sensors including magnetic tunnel junction elements are arrayed to acquire a three-dimensional magnetic field distribution.

It is disclosed in Japanese Unexamined Patent Application Publication No. 2013-120080 that the magnitude of the magnetic field is measured by using a TMR sensor including magnetic tunnel junction elements and a feedback coil.

However, in all of the magnetic sensors described in Japanese Unexamined Patent Application Publication No. 8-226960, Japanese Unexamined Patent Application Publication No. 2002-299728, Japanese Unexamined Patent Application Publication No. 2013-64666, U.S. Patent Application Publication No. 2008/0180865, U.S. Patent Application Publication No. 2015/0185297, Japanese Unexamined Patent Application Publication No. 2012-110470, Japanese Unexamined Patent Application Publication No. 2013-120080 and J. Zhu and C. Park, "Magnetic Tunnel Junctions", Materials Today 9, (2006), Yasuo Ando, "Development of Bio-Magnetic Sensor using TMR", The 5th IWASAKI Conference "Magnetic Sensor and its Utilization Leading to Improvement in Infrastructure", Nov. 27, 2017, R. Antos, Y. Otani and J. Shibata, "Magnetic Vortex Dynamics", J. Phys. Soc. Jpn. 77, 031004 (2008), M. Schneider, H. Hoffmann and J. Zweck, "Lorentz Microscopy of Circular Ferromagnetic Permalloy Nanodisks", Appl. Phys. Lett. 77, 2909 (2000), Motoki Endo, Mikihiko Oogane, Hiroshi Naganuma, and Yasuo Ando, "Magnetic Tunnel Junction Sensor Applying Magnetic Vortex State", Digests of the 39th Annual Conference on Magnetics in Japan 2015, 10pE-12, 277 (2015), T. Wurft, W. Raberg, K. Prugl, A. Satz, G. Reiss and H. Bruckl, "The Influence of Edge Inhomogeneities on Vortex Hysteresis Curves in Magnetic Tunnel Junctions", IEEE Transactions on Magnetics AF-05, 1 (2017), as for an external magnetic field inputted at an unknown angle, it is not sufficiently studied to accurately measure both of the angle of the magnetic field and the magnitude of the magnetic field.

SUMMARY OF THE INVENTION

Preferred embodiments of the present invention provide magnetic sensors, magnetic sensor arrays, magnetic field distribution measurement devices, and position identification devices that are each able to detect the angle of the external magnetic field and also to detect, based on the detected angle, the strength of the external magnetic field.

A magnetic sensor according to a preferred embodiment of the present disclosure includes an angle sensor which includes a plurality of first magnetoresistive elements and produces an output based on an angle between a direction of an external magnetic field and a reference direction; and a magnetic field strength sensor which includes a plurality of second magnetoresistive elements and produces an output based on a strength of the external magnetic field. The angle sensor and the magnetic field strength sensor mutually have a same or substantially a same direction normal or substantially normal to a reference surface for sensor formation. The magnetic field strength sensor has different output characteristics in accordance with the angle between the direction of the external magnetic field and the reference direction. Based on the angle between the direction of the external magnetic field and the reference direction detected by the angle sensor and the output from the magnetic field strength sensor, the strength of the external magnetic field is determined.

In a magnetic sensor according to a preferred embodiment of the present disclosure, the angle sensor and the magnetic field strength sensor are provided on a same substrate.

In a magnetic sensor according to a preferred embodiment of the present disclosure, as output characteristics with respect to the angle between the direction of the external magnetic field and the reference direction, the angle sensor has output characteristics represented by a cosine function, and as output characteristics with respect to the strength of the external magnetic field, the magnetic field strength sensor has output characteristics represented by a straight line. In addition, a nonlinearity distribution with respect to the angle between the direction of the external magnetic field and the reference direction in the output characteristics of the magnetic field strength sensor is constant or substantially constant. Here, nonlinearity is defined as being expressed in % FS by taking, at a certain external magnetic field angle, an output range of variation (full scale) in a measurement magnetic field range as a denominator and the amount of deviation of a measurement output with respect to an ideal line as a numerator.

In a magnetic sensor according to a preferred embodiment of the present disclosure, the plurality of first magnetoresistive elements and the plurality of second magnetoresistive elements each may have a circular or substantially circular shape in plan view.

In a magnetic sensor according to a preferred embodiment of the present disclosure, each of the plurality of second magnetoresistive elements includes a reference layer in which magnetization is fixed in a predetermined in-plane direction parallel or substantially parallel to a film surface and a free layer which is vertically magnetized about an axis perpendicular or substantially perpendicular to the film surface and in which a center of a vortex moves in accordance with the external magnetic field.

In a magnetic sensor according to a preferred embodiment of the present disclosure, the angle sensor includes a first sensor and a second sensor having different output characteristics with respect to the angle between the direction of the external magnetic field and the reference direction. In addition, the first sensor and the second sensor each include the plurality of first magnetoresistive elements each including a reference layer in which a magnetization direction is fixed and a free layer in which a direction of magnetization changes in accordance with the direction of the external magnetic field. In this case, the magnetization direction of the reference layer in the first sensor and the magnetization direction of the reference layer in the second sensor are different.

In a magnetic sensor according to a preferred embodiment of the present disclosure, the magnetization direction of the reference layer in the first sensor and the magnetization direction of the reference layer in the second sensor may be different by about 90°. In this case, when an output in the first sensor is denoted as Vout1 (mV), an output in the second sensor is denoted as Vout2 (mV), and the angle between the direction of the external magnetic field and the reference direction is denoted as θ, the angle between the direction of the external magnetic field and the reference direction is calculated from Equation (1) below.

$$\theta = \tan^{-1}(Vout2/Vout1) \qquad \text{Equation (1)}$$

In a magnetic sensor according to a preferred embodiment of the present disclosure, the magnetic field strength sensor includes a third sensor and a fourth sensor having different output characteristics with respect to the strength of the external magnetic field. In addition, the third sensor and the fourth sensor each include a reference layer in which magnetization is fixed in a predetermined in-plane direction parallel or substantially parallel to a film surface and a free layer which is vertically magnetized about an axis perpendicular or substantially perpendicular to the film surface and in which a center of a vortex moves in accordance with the external magnetic field. In this case, a magnetization direction of the reference layer in the third sensor and a magnetization direction of the reference layer in the fourth sensor are different.

In a magnetic sensor according to a preferred embodiment of the present disclosure, the magnetization direction of the reference layer in the third sensor and the magnetization direction of the reference layer in the fourth sensor may be different by about 90°.

In a magnetic sensor according to a preferred embodiment of the present disclosure, when an output in the third sensor is denoted as Vout3 (mV), an output in the fourth sensor is denoted as Vout4 (mV)), the angle between the direction of the external magnetic field and the reference direction is denoted as θ, a sensitivity of the third sensor where θ=0° is denoted as G3 (mV/mT), a sensitivity of the fourth sensor where θ=0° is denoted as G4 (mV/mT), the strength of the external magnetic field detected by the third sensor is denoted as B3, and the strength of the external magnetic field detected by the fourth sensor is denoted as B4, the strength of the external magnetic field is calculated from Equation (2) and Equation (3) below except θ=0°, 90°, 180°, 270°, the strength of the external magnetic field is calculated from the Equation (2) when θ=0°, 180°; and the strength of the external magnetic field is calculated from the Equation (3) when θ=90°, 270°.

$$B3 = Vout3/G3 \cos\theta \qquad \text{Equation (2)}$$

$$B4 = Vout4/G4 \sin\theta \qquad \text{Equation (3)}$$

In a magnetic sensor according to a preferred embodiment of the present disclosure, the plurality of first magnetoresistive elements may include one or more sets of paired first magnetoresistive elements defining a half-bridge circuit. In this case, each of the paired first magnetoresistive elements includes a reference layer in which a magnetization direction is fixed and a free layer in which a direction of magnetization changes in accordance with the direction of the external magnetic field, and in the paired first magnetoresistive elements, the magnetization direction of the reference layer in one of the first magnetoresistive elements is opposite to the magnetization direction of the reference layer in another of the first magnetoresistive elements. In addition, the plurality of second magnetoresistive elements may include one or more sets of paired second magnetoresistive effect elements defining a half-bridge circuit. In this case, preferably, each of the paired second magnetoresistive effect elements includes a reference layer in which magnetization is fixed in a predetermined in-plane direction parallel or substantially parallel to a film surface and a free layer which is vortically magnetized about an axis perpendicular or substantially perpendicular to the film surface and in which a center of a vortex moves in accordance with the external magnetic field, and in the paired second magnetoresistive elements, a magnetization direction of the reference layer in one of the second magnetoresistive elements is opposite to a magnetization direction of the reference layer in another of the second magnetoresistive elements.

In a magnetic sensor according to a preferred embodiment of the present disclosure, the plurality of first magnetoresistive elements may include one or more groups of the paired first magnetoresistive elements defining a first half-bridge circuit and the paired first magnetoresistive elements defining a second half-bridge circuit. In this case, a full-bridge circuit is defined by the first half-bridge circuit and the second half-bridge circuit. In addition, preferably, a magnetization direction of the reference layer in one first magnetoresistive element of the paired first magnetoresistive elements of the first half-bridge circuit and a magnetization direction of the reference layer in one first magnetoresistive element of the paired first magnetoresistive elements of the second half-bridge circuit are the same or substantially the same. Furthermore, the plurality of second magnetoresistive elements may include one or more groups of the paired second magnetoresistive elements defining a third half-bridge circuit and the paired second magnetoresistive elements defining a fourth half-bridge circuit. In this case, a full-bridge circuit is defined by the third half-bridge circuit and the fourth half-bridge circuit. In addition, a magnetization direction of the reference layer in one second magnetoresistive element of the paired second magnetoresistive elements of the third half-bridge circuit and a magnetization direction of the reference layer in one second magnetoresistive element of the paired second magnetoresistive elements of the fourth half-bridge circuit are the same.

In a magnetic sensor according to a preferred embodiment of the present disclosure, each of the plurality of first magnetoresistive elements may include a reference layer in which magnetization is fixed in a predetermined in-plane direction parallel or substantially parallel to a film surface and a free layer which is vortically magnetized about an axis perpendicular or substantially perpendicular to the film surface and in which a center of a vortex moves in accordance with the external magnetic field.

A magnetic sensor according to a preferred embodiment of the present disclosure may further include a first cancel magnetic field generator and a second cancel magnetic field generator which generate a cancel magnetic field to cancel the external magnetic field provided to the magnetic field strength sensor, and a current controller which controls a current flowing through the first cancel magnetic field generator and the second cancel magnetic field generator. In this case, the current controller controls the current based on the angle between the direction of the external magnetic field and the reference direction detected by the angle sensor.

In a magnetic sensor according to a preferred embodiment of the present disclosure, the magnetic field strength sensor includes a third sensor and a fourth sensor having different output characteristics with respect to the strength of the external magnetic field. In addition, the third sensor and the fourth sensor each include a reference layer in which magnetization is fixed in a predetermined in-plane direction parallel or substantially parallel to a film surface and a free layer which is vortically magnetized about an axis perpendicular or substantially perpendicular to the film surface and in which a center of a vortex moves in accordance with the external magnetic field, and a magnetization direction of the reference layer in the third sensor and a magnetization direction of the reference layer in the fourth sensor are different. In addition, the external magnetic field is canceled by a synthetic magnetic field of a first cancel magnetic field generated by the first cancel magnetic field generator and a second cancel magnetic field generated by the second cancel magnetic field generator. In this case, a direction of the first cancel magnetic field is parallel or substantially parallel to the magnetization direction of the reference layer in the third sensor, and a direction of the second cancel magnetic field is parallel or substantially parallel to the magnetization direction of the reference layer in the fourth sensor.

In a magnetic sensor according to a preferred embodiment of the present disclosure, the second cancel magnetic field generator, the first cancel magnetic field generator, and the magnetic field strength sensor are sequentially laminated. In addition, a first insulating layer is provided between the second cancel magnetic field generator and the first cancel magnetic field generator, and a second insulating layer is provided between the first cancel magnetic field generator and the magnetic field strength sensor.

A sensor array according to a preferred embodiment of the present disclosure includes a plurality of magnetic sensors according to a preferred embodiment of the present disclosure. The plurality of magnetic sensors are arranged in a matrix.

In a sensor array according to a preferred embodiment of the present disclosure, the magnetic sensor includes a first area and a second area surrounding a periphery of the first area. In this case, in the first area, one of the angle sensor and the magnetic field strength sensor is provided, and in the second area, another one of the angle sensor and the magnetic field strength sensor is provided. In addition, the first area and the second area have an axisymmetric shape with respect to a virtual line passing through a center of the first area.

A magnetic field distribution measurement device according to a preferred embodiment of the present disclosure includes a magnetic sensor according to a preferred embodiment of the present disclosure, and a sensor movement mechanism which moves the magnetic sensor to at least any direction of an X-axis direction, a Y-axis direction, and a Z-axis direction.

A position identification device according to a preferred embodiment of the present disclosure includes a magnetic sensor according to a preferred embodiment of the present disclosure, and a movable body including a magnetic field source and configured to be movable.

According to preferred embodiments of the present disclosure, it is possible to provide magnetic sensors, magnetic sensor arrays, magnetic field distribution measurement devices, and position identification devices that are each able to detect the angle of the external magnetic field and also to detect, based on the detected angle, the strength of the external magnetic field.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
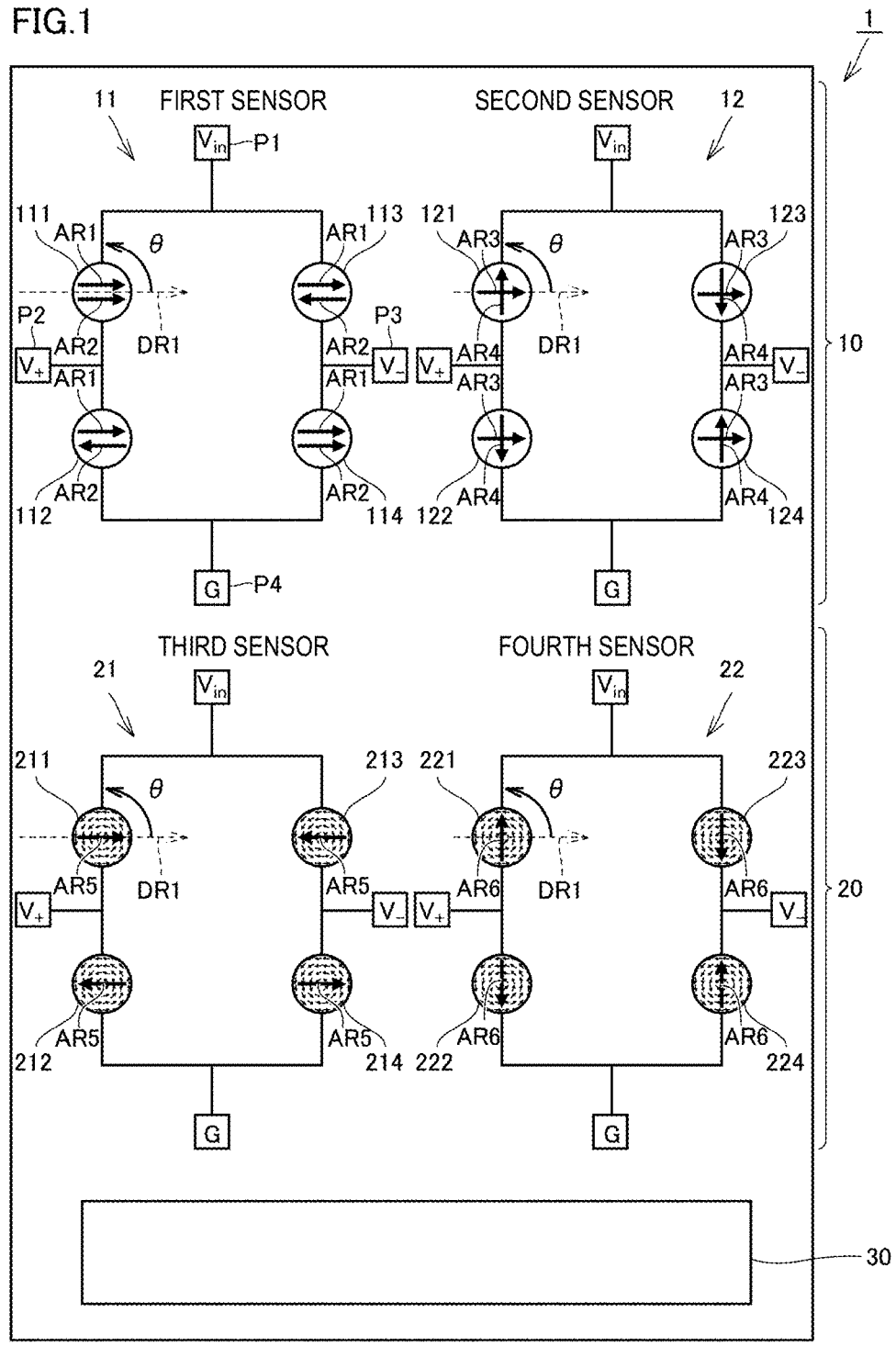
FIG. 1 is a schematic view showing a magnetic sensor according to a first preferred embodiment of the present invention.

Preferred embodiments of the present invention are described below in detail with reference to the drawings. In the preferred embodiments described below, the same or common portions are denoted by the same reference characters in the drawings and are not repeatedly described.

First Preferred Embodiment

FIG. 1 is a schematic view showing a magnetic sensor according to a first preferred embodiment of the present invention. With reference to FIG. 1, a magnetic sensor 1 according to the first preferred embodiment is described.

The magnetic sensor 1 includes an angle sensor 10, a magnetic field strength sensor 20, and a calculator 30. The angle sensor 10, the magnetic field strength sensor 20, and the calculator 30 are provided on a same substrate 61 (refer to FIG. 11). The angle sensor 10 and the magnetic field strength sensor 20 are arranged in a planar manner. That is, the angle sensor 10 and the magnetic field strength sensor 20 mutually have the same direction of normal to a reference surface for sensor formation. Here, the function of the calculator may be provided on the same substrate or may be provided on an integrated circuit substrate provided separately from the sensors.

The angle sensor 10 is a portion of the magnetic sensor 1 to measure the angle of an external magnetic field. The angle sensor 10 includes a first sensor 11 and a second sensor 12.

The first sensor 11 includes a plurality of first magnetoresistive elements 111, 112, 113, and 114. The plurality of first magnetoresistive elements 111, 112, 113, and 114 each have a circular or substantially circular shape in plan view. This can eliminate angular dependency of shape anisotropy and make the output characteristics appropriate.

The plurality of first magnetoresistive elements 111, 112, 113, and 114 define a full-bridge circuit.

Specifically, one side of the first magnetoresistive element 111 is connected to an electrode P1 to apply a power supply voltage Vin. The other side of the first magnetoresistive element 111 is connected to an electrode P2 to output an output voltage V+.

One side of the first magnetoresistive element 112 is connected to the electrode P2 to output the output voltage V+. The other side of the first magnetoresistive element 112 is connected to an electrode P4 as a ground electrode.

One side of the first magnetoresistive element 113 is connected to the electrode P1 to apply the power supply voltage Vin. The other side of the first magnetoresistive element 113 is connected to the electrode P3 to output an output voltage V−.

One side of the first magnetoresistive element 114 is connected to the electrode P3 to output the output voltage V−. The other side of the first magnetoresistive element 114 is connected to the electrode P4 as the ground electrode.

With the first magnetoresistive element 111 and the first magnetoresistive element 112 connected in series, a first half-bridge circuit is configured. With the first magnetoresistive element 113 and the first magnetoresistive element 114 connected in series, a second half-bridge circuit is configured.

With the first half-bridge circuit and the second half-bridge circuit connected in parallel, a full-bridge circuit is provided. A gradient of the first magnetoresistive element 111 and the first magnetoresistive element 112 is positive when the horizontal axis indicates the external magnetic field and the vertical axis indicates the output. A gradient of the first magnetoresistive element 113 and the first magnetoresistive element 114, is positive when the horizontal axis indicates the external magnetic field and the vertical axis indicates the output.

When the power supply voltage Vin is applied between the electrode P1 and the electrode P4, the output voltages V+ and V− are output from the electrode P2 and the electrode P4 in accordance with the magnetic field strength. The output voltages V+ and V− are subjected to differential amplification by a differential amplifier (not shown).

The plurality of first magnetoresistive elements 111, 112, 113, and 114 each include, as will be described further below, a lower ferromagnetic layer 105 as a reference layer and an upper ferromagnetic layer 107 as a free layer. In the lower ferromagnetic layer 105, magnetization is fixed in a predetermined in-plane direction parallel or substantially parallel to the film surface. On the other hand, in the upper ferromagnetic layer 107, magnetization is not fixed.

In each of the plurality of first magnetoresistive elements 111, 112, 113, and 114, the magnetization direction of the lower ferromagnetic layer 105 is as indicated by an arrow AR2.

Specifically, in the paired first magnetoresistive elements 111 and 112 of the first half-bridge circuit, the magnetization direction of the lower ferromagnetic layer 105 in the first magnetoresistive element 111 is opposite to the magnetization direction of the lower ferromagnetic layer 105 in the first magnetoresistive element 112.

Similarly, in the paired first magnetoresistive elements 113 and 114 of the second half-bridge circuit, the magnetization direction of the lower ferromagnetic layer 105 in the first magnetoresistive element 113 is opposite to the magnetization direction of the lower ferromagnetic layer 105 in the first magnetoresistive element 114.

Also, the magnetization direction of the lower ferromagnetic layer 105 of the first magnetoresistive element 111 in the first half-bridge circuit is the same as the magnetization direction of the lower ferromagnetic layer 105 of the first magnetoresistive element 114 in the second half-bridge circuit.

Similarly, the magnetization direction of the lower ferromagnetic layer 105 of the first magnetoresistive element 112 in the first half-bridge circuit is the same as the magnetization direction of the lower ferromagnetic layer 105 of the first magnetoresistive element 113 in the second half-bridge circuit.

Note that when the external magnetic field is applied in a reference direction DR1 with an angle θ, the magnetization direction (arrow AR1 direction) of the upper ferromagnetic layer 107 in each of the first magnetoresistive elements 111, 112, 113, and 114 is rotated by the angle θ. This changes the output from the angle sensor 10.

The second sensor 12 includes a plurality of first magnetoresistive elements 121, 122, 123, and 124. The plurality of first magnetoresistive elements 121, 122, 123, and 124 each have a circular or substantially circular shape in plan view. This can eliminate angular dependency of shape anisotropy and make the output characteristics appropriate.

The plurality of first magnetoresistive elements 121, 122, 123, and 124 define a full-bridge circuit. With the first magnetoresistive element 121 and the first magnetoresistive element 122 connected in series, a first half-bridge circuit is provided. With the first magnetoresistive element 123 and the first magnetoresistive element 124 connected in series, a second half-bridge circuit is provided. Note that the connection structure of these bridge circuits is the same or substantially the same as that of the first sensor 11 and its description is omitted.

Compared with the first sensor 11, in the second sensor 12, the magnetization direction of the reference layer (lower ferromagnetic layer) in each of the first magnetoresistive elements 121, 122, 123, and 124 is different from the magnetization direction of the reference layer (lower ferromagnetic layer) in the corresponding one of the first magnetoresistive elements 111, 112, 113, and 114.

Specifically, the magnetization direction of the reference layer in each of the first magnetoresistive elements 121, 122, 123, and 124 is different by about 90° from the magnetization direction of the reference layer in the corresponding one of the first magnetoresistive elements 111, 112, 113, and 114.

The plurality of first magnetoresistive elements 121, 122, 123, and 124 also each include the upper ferromagnetic layer 107 where magnetization is not fixed (refer to FIG. 2) and the lower ferromagnetic layer 105 with magnetization fixed in a predetermined in-plane direction.

In each of the plurality of first magnetoresistive elements 121, 122, 123, and 124, the magnetization direction of the lower ferromagnetic layer 105 is as indicated by an arrow AR4.

Also in the second sensor 12, in the paired first magnetoresistive elements 121 and 122 of the first half-bridge circuit, the magnetization direction of the lower ferromagnetic layer 105 in the first magnetoresistive element 121 is opposite to the magnetization direction of the lower ferromagnetic layer 105 in the first magnetoresistive element 122.

Similarly, in the paired first magnetoresistive elements 123 and 124 of the second half-bridge circuit, the magnetization direction of the lower ferromagnetic layer 105 in the first magnetoresistive element 123 is opposite to the magnetization direction of the lower ferromagnetic layer 105 in the first magnetoresistive element 124.

Also, the magnetization direction of the lower ferromagnetic layer 105 of the first magnetoresistive element 121 in the first half-bridge circuit is the same as the magnetization direction of the lower ferromagnetic layer 105 of the first magnetoresistive element 124 in the second half-bridge circuit.

Similarly, the magnetization direction of the lower ferromagnetic layer 105 of the first magnetoresistive element 122 in the first half-bridge circuit is the same as the magnetization direction of the lower ferromagnetic layer 105 of the first magnetoresistive element 123 in the second half-bridge circuit.

Note that when the external magnetic field is applied in the reference direction DR1 with the angle θ, the magnetization direction (arrow AR3 direction) of the upper ferromagnetic layer 107 in each of the first magnetoresistive elements 121, 122, 123, and 124 is rotated by the angle θ. This changes the output from the angle sensor 10.

The magnetic field strength sensor 20 is a portion of the magnetic sensor 1 to measure the strength of the external magnetic field. The magnetic field strength sensor 20 includes a third sensor 21 and a fourth sensor 22.

The third sensor 21 includes a plurality of second magnetoresistive elements 211, 212, 213, and 214. The plurality of second magnetoresistive elements 211, 212, 213, and 214 each have a circular or substantially circular shape in plan view.

The plurality of second magnetoresistive elements 211, 212, 213, and 214 define a full-bridge circuit. With the second magnetoresistive element 211 and the second magnetoresistive element 212 connected in series, a third half-bridge circuit is provided. With the second magnetoresistive element 213 and the second magnetoresistive element 214 connected in series, a fourth half-bridge circuit is provided. Note that the connection structure of these bridge circuits is the same or substantially the same as that of the first sensor 11 and its description is omitted.

The plurality of second magnetoresistive elements 211, 212, 213, and 214 each include, as will be described further below, a lower ferromagnetic layer 205 as a reference layer (refer to FIG. 3) and an upper ferromagnetic layer 207 as a free layer (refer to FIG. 3). In the lower ferromagnetic layer 205, magnetization is fixed in a predetermined direction parallel or substantially parallel to the film surface. The upper ferromagnetic layer 207 is vortically magnetized about an axis perpendicular or substantially perpendicular to the film surface. When an external magnetic field is applied, the center of the magnetized vortex moves in accordance with the external magnetic field. As described above, as the disk aspect ratio (=the film thickness of the free layer/disk diameter) increases, the linear area of the magnetoresistive element having the magnetic structure expands. By using the magnetoresistive element having this magnetic vortex structure, the range of the input magnetic field can be expanded.

In a state in which no external magnetic field is applied, in each of the plurality of second magnetoresistive elements 211, 212, 213, and 214, the magnetization direction of the lower ferromagnetic layer 205 is indicated by an arrow AR5.

In the paired second magnetoresistive elements 211 and 212 of the third half-bridge circuit, the magnetization direction of the lower ferromagnetic layer 205 in the second magnetoresistive element 211 is opposite to the magnetization direction of the lower ferromagnetic layer 205 in the second magnetoresistive element 212.

Similarly, in the paired second magnetoresistive elements 213 and 214 of the fourth half-bridge circuit, the magnetization direction of the lower ferromagnetic layer 205 in the second magnetoresistive element 213 is opposite to the magnetization direction of the lower ferromagnetic layer 205 in the second magnetoresistive element 214.

Also, the magnetization direction of the lower ferromagnetic layer 205 of the second magnetoresistive element 211 in the third half-bridge circuit is the same as the magnetization direction of the lower ferromagnetic layer 205 of the second magnetoresistive element 214 in the fourth half-bridge circuit.

Similarly, the magnetization direction of the lower ferromagnetic layer 205 of the second magnetoresistive element 212 in the third half-bridge circuit is the same as the magnetization direction of the lower ferromagnetic layer 205 of the second magnetoresistive element 213 in the fourth half-bridge circuit.

The fourth sensor 22 includes a plurality of second magnetoresistive elements 221, 222, 223, and 224. The plurality of second magnetoresistive elements 221, 222, 223, and 224 each have a circular or substantially circular shape in plan view.

The plurality of second magnetoresistive elements 221, 222, 223, and 224 define a full-bridge circuit. With the second magnetoresistive element 221 and the second magnetoresistive element 222 connected in series, a third half-bridge circuit is provided. With the second magnetoresistive element 223 and the second magnetoresistive element 224 connected in series, a fourth half-bridge circuit is provided. Note that the connection structure of these bridge circuits is the same or substantially the same as that of the first sensor 11 and its description is omitted.

Compared with the third sensor 21, in the fourth sensor 22, the magnetization direction of the lower ferromagnetic layer 205 in each of the second magnetoresistive elements 221, 222, 223, and 224 is different from the magnetization direction of the reference layer in the corresponding one of the second magnetoresistive elements 211, 212, 213, and 214.

Specifically, the magnetization direction of the reference layer in each of the second magnetoresistive elements 221, 222, 223, and 224 is different by about 90° from the magnetization direction of the reference layer in the corresponding one of the second magnetoresistive elements 211, 212, 213, and 214.

The plurality of second magnetoresistive elements 221, 222, 223, and 224 also each include the upper ferromagnetic layer 207 (refer to FIG. 3) and the lower ferromagnetic layer 205 with magnetization fixed in a predetermined in-plane direction.

In each of the plurality of second magnetoresistive elements 221, 222, 223, and 224, the magnetization direction of the lower ferromagnetic layer 205 is as indicated by an arrow AR6.

Also in the fourth sensor 22, in the paired second magnetoresistive elements 221 and 222 of the third half-bridge circuit, the magnetization direction of the lower ferromagnetic layer 205 in the second magnetoresistive element 221 is opposite to the magnetization direction of the lower ferromagnetic layer 205 in the second magnetoresistive element 222.

Similarly, in the paired second magnetoresistive elements 223 and 224 of the fourth half-bridge circuit, the magnetization direction of the lower ferromagnetic layer 205 in the second magnetoresistive element 223 is opposite to the magnetization direction of the lower ferromagnetic layer 205 in the second magnetoresistive element 224.

Also, the magnetization direction of the lower ferromagnetic layer 205 of the second magnetoresistive element 221 in the third half-bridge circuit is the same as the magnetization direction of the lower ferromagnetic layer 205 of the second magnetoresistive element 224 in the fourth half-bridge circuit.

Similarly, the magnetization direction of the lower ferromagnetic layer 205 of the second magnetoresistive element 222 in the third half-bridge circuit is the same as the magnetization direction of the lower ferromagnetic layer 205 of the second magnetoresistive element 223 in the fourth half-bridge circuit.

To the calculator 30, outputs from the angle sensor 10 and outputs from the magnetic field strength sensor 20 are inputted. Specifically, to the calculator 30, outputs from the first sensor 11, the second sensor 12, the third sensor 21, and the fourth sensor 22 are inputted.

As will be described further below, the calculator 30 determines the angle θ of the external magnetic field based on the outputs from the angle sensor 10, and determines the strength of the external magnetic field based on the determined angle θ and the outputs from the magnetic field strength sensor 20.

Figure 2:
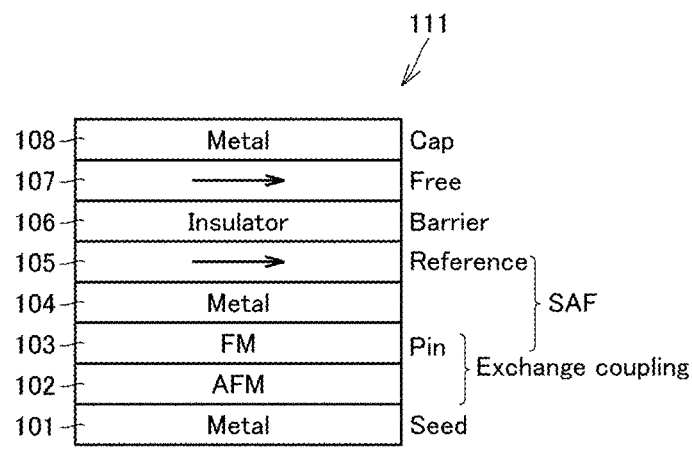
FIG. 2 is a schematic sectional view showing the structure of a first magnetoresistive element according to the first preferred embodiment of the present invention.

FIG. 2 is a schematic sectional view showing the structure of the first magnetoresistive element according to the first preferred embodiment. With reference to FIG. 2, the structure of the first magnetoresistive element 111 is described. Note that the structure of the other first magnetoresistive elements is the same or substantially the same as the structure of the first magnetoresistive element 111 and its description is thus omitted.

As shown in FIG. 2, the first magnetoresistive element 111 is, for example, a bottom-pinned TMR element using synthetic anti-ferromagnetic (SAF) coupling. Here, the structure is described as one example, but SAF may not be used, or a top-pinned TMR element may be used, for example.

The first magnetoresistive element 111 includes a lower electrode layer 101, an anti-ferromagnetic layer 102, a ferromagnetic layer 103 (pinned layer), a non-magnetic layer 104, a lower ferromagnetic layer 105 (reference layer), an insulating layer 106, an upper ferromagnetic layer 107, and a cap layer 108.

The lower electrode layer 101 defines and functions as a seed layer for the crystal of the anti-ferromagnetic layer 102 to appropriately grow. As the lower electrode layer 101, for example, a multilayer film of Ru and Ta can be used. Note that as the lower electrode layer 101, it is possible to use, for example, a single metal film made of another metal or an alloy or one with the plurality of types of the above-described metal films laminated.

The anti-ferromagnetic layer 102 is provided on the lower electrode layer 101. As the anti-ferromagnetic layer 102, for example, PtMn can be used. The anti-ferromagnetic layer 102 may be, for example, an alloy including Mn such as IrMn.

The ferromagnetic layer 103 is provided on the anti-ferromagnetic layer 102. As the ferromagnetic layer 103, for example, CoFe can be used. The ferromagnetic layer 103 may be, for example, CoFeB or the like. Magnetization of the ferromagnetic layer 103 is fixed in a predetermined in-plane direction by exchange coupling magnetic field acting from the anti-ferromagnetic layer 102.

The non-magnetic layer 104 is provided on the ferromagnetic layer 103. For the non-magnetic layer 104, for example, Ru can be used.

The lower ferromagnetic layer 105 is provided on the non-magnetic layer 104. As the lower ferromagnetic layer 105, for example, CoFeB can be used. The ferromagnetic layer 103 may be, for example, CoFe or the like.

The ferromagnetic layer 103, non-magnetic layer 104, and lower ferromagnetic layer 105 define a SAF structure. With this, the direction of magnetization of the lower ferromagnetic layer 105 as a first reference layer is firmly fixed.

The insulating layer 106 is provided on the lower ferromagnetic layer 105. As an insulating layer, for example, MgO can be used. The insulating layer 106 is arranged between the upper ferromagnetic layer 107 and the lower ferromagnetic layer 105, and defines and functions as a tunnel barrier layer.

The upper ferromagnetic layer 107 is provided on the insulating layer 106. As the upper ferromagnetic layer 107, for example, CoFeB can be used. The upper ferromagnetic layer 107 may be, for example, NiFe or the like.

In the upper ferromagnetic layer 107, magnetization is not fixed, and the upper ferromagnetic layer 107 defines and functions as a free layer. The orientation of magnetization of the upper ferromagnetic layer 107 is changed in accordance with the external magnetic field.

The cap layer 108 is provided on the upper ferromagnetic layer 107. For example, a multilayer film of Ru and Ta can be used. As the cap layer 108, it is possible to use a single metal film made of another metal or an alloy or one with the plurality of types of the metal films laminated.

The lower electrode layer 101, anti-ferromagnetic layer 102, ferromagnetic layer 103, non-magnetic layer 104, lower ferromagnetic layer 105, insulating layer 106, upper ferromagnetic layer 107, and cap layer 108 represent examples and may each include a single layer or a plurality of laminated layers. The above-described lower electrode layer 101, anti-ferromagnetic layer 102, ferromagnetic layer 103, non-magnetic layer 104, lower ferromagnetic layer 105, insulating layer 106, upper ferromagnetic layer 107, and cap layer 108 can be appropriately selected.

Figure 3:
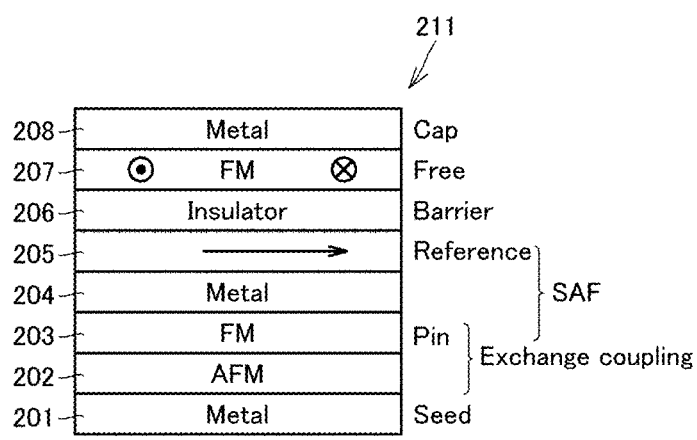
FIG. 3 is a schematic sectional view showing the structure of a second magnetoresistive element according to the first preferred embodiment of the present invention.

FIG. 3 is a schematic sectional view showing the structure of the second magnetoresistive element according to the first preferred embodiment. With reference to FIG. 3, the structure of the second magnetoresistive element 211 is described. The structure of the other second magnetoresistive elements is the same or substantially the same as the structure of the second magnetoresistive element 211 and its description is thus omitted.

As shown in FIG. 3, the second magnetoresistive element 211 is, for example, a bottom-pinned TMR element using synthetic anti-ferromagnetic (SAF) coupling. Here, the structure is described as one example, but SAF may not be used, or a top-pinned TMR element may be used, for example.

The second magnetoresistive element 211 includes a lower electrode layer 201, an anti-ferromagnetic layer 202, a ferromagnetic layer 203 (pinned layer), a non-magnetic layer 204, a lower ferromagnetic layer 205 (reference layer), an insulating layer 206, an upper ferromagnetic layer 207, and a cap layer 208.

Compared with the first magnetoresistive element 111, the difference is that the upper ferromagnetic layer 207 is vortically magnetized, and the other structures are the same or substantially the same. That is, the lower electrode layer 201, the anti-ferromagnetic layer 202, the ferromagnetic layer 203, the non-magnetic layer 204, the lower ferromagnetic layer 205, the insulating layer 206, and the cap layer 208 have structures the same or substantially the same as those of the lower electrode layer 101, anti-ferromagnetic layer 102, ferromagnetic layer 103, non-magnetic layer 104, lower ferromagnetic layer 105, insulating layer 106, and cap layer 108. Therefore, detailed description of these is omitted.

The upper ferromagnetic layer 207 has a magnetic vortex structure. The upper ferromagnetic layer 207 defines and functions as a free layer. The orientation of magnetization of the upper ferromagnetic layer 207 is changed in accordance with the external magnetic field.

Figure 4:
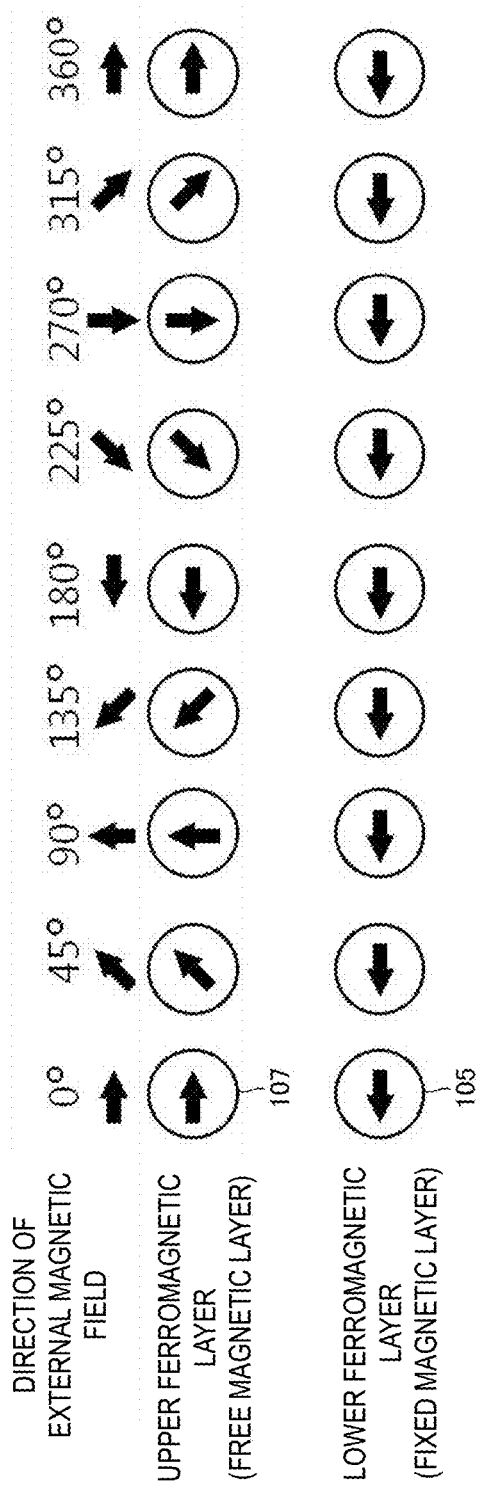
FIG. 4 is a diagram showing a state in which magnetization in an upper ferromagnetic layer (free layer) of the first magnetoresistive element according to the first preferred embodiment of the present invention is changed in accordance with an external magnetic field.

FIG. 4 is a diagram showing a state in which magnetization in the upper ferromagnetic layer (free layer) of the first magnetoresistive element according to the first preferred embodiment is changed in accordance with an external magnetic field. FIG. 4 shows a state in which the upper ferromagnetic layer 107 and the lower ferromagnetic layer 105 are each in plan view.

Also, FIG. 4 shows, as an example, changes in orientation of magnetization in the free layer 107 by changes of the angle of the external magnetic field. The fixed orientation of magnetization in the lower ferromagnetic layer 105 as a reference layer is oriented to left in FIG. 4.

In this case, the left side in FIG. 4 shows a case in which the external magnetic field is applied in a 0° direction (right direction, specifically, DR1 direction in FIG. 1 and FIG. 17), and magnetization of the free layer 107 becomes antiparallel or substantially antiparallel to the fixed orientation of magnetization of the reference layer 105. In the right side in the drawing, cases in which the angle of the external magnetic field is incremented by 45° are shown. The third in FIG. 4 shows a case in which the external magnetic field is applied in a 90° direction (upper direction), and magnetization of the free layer 107 is orthogonal or substantially orthogonal to magnetization of the reference layer 105. The center in FIG. 4 shows a case in which the external magnetic field is applied in a 180° direction (left direction), and magnetization of the free layer 107 becomes parallel or substantially parallel to the fixed orientation of magnetization of the reference layer 105. The seventh in FIG. 4 shows a case in which the external magnetic field is applied in a 270° direction (lower direction), and magnetization of the free layer 107 is orthogonal or substantially orthogonal to magnetization of the reference layer 105. The right side in FIG. 4 shows a case in which the external magnetic field is applied in a 360° direction (right direction), and magnetization of the free layer 107 becomes antiparallel or substantially antiparallel to the fixed orientation of magnetization of the reference layer 105.

Figure 5:
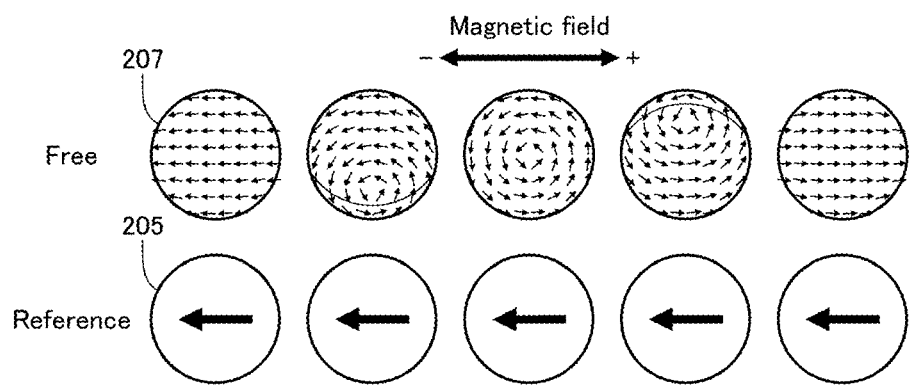
FIG. 5 is a diagram showing a state in which vortical magnetization in an upper ferromagnetic layer (free layer) of the second magnetoresistive element according to the first preferred embodiment of the present invention is changed in accordance with an external magnetic field.

FIG. 5 is a diagram showing a state in which vortical magnetization in the upper ferromagnetic layer (free layer) of the second magnetoresistive element according to the first preferred embodiment is changed in accordance with an external magnetic field.

FIG. 5 shows, as one example, changes in orientation of vortical magnetization in the free layer 207 by changes of the external magnetic field from 0° or 180° direction. The fixed orientation of magnetization in the lower ferromagnetic layer 205 as a second reference layer is oriented to left in FIG. 5.

Figure 17:
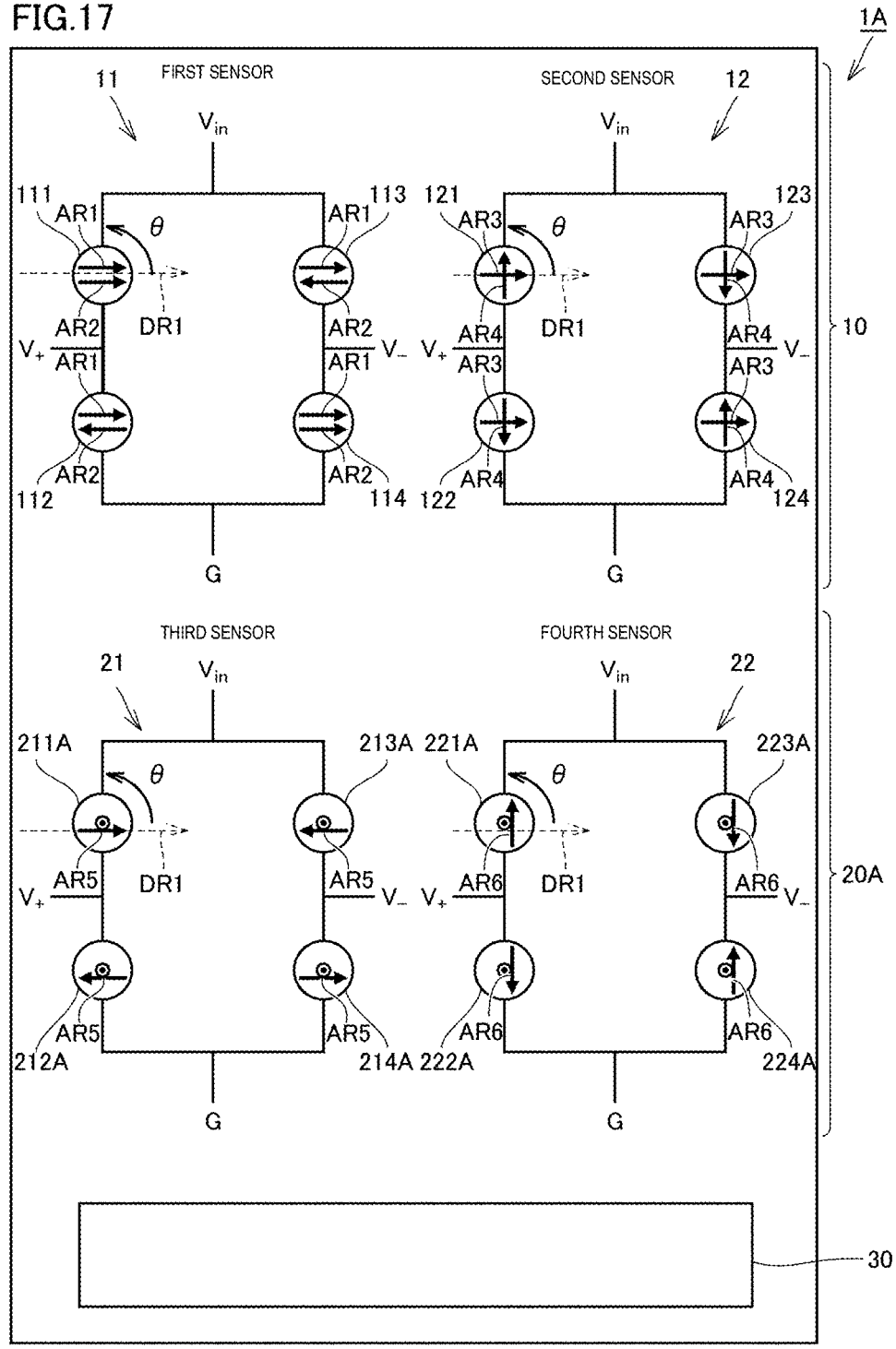
FIG. 17 is a schematic view showing a magnetic sensor according to a second preferred embodiment of the present invention.
Figure 33:
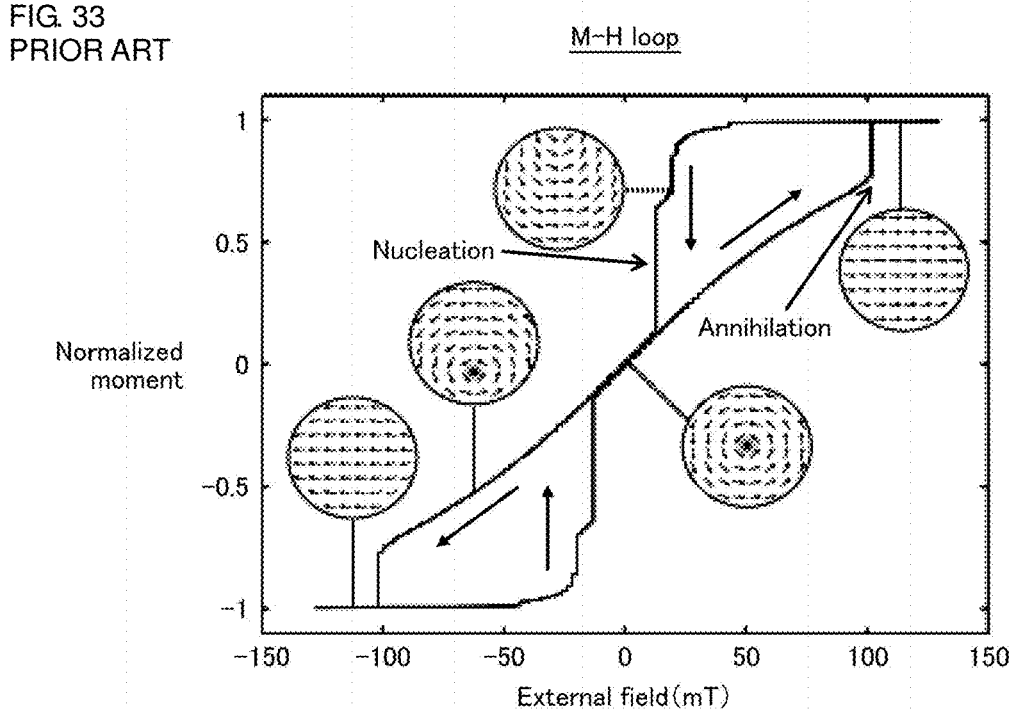
FIG. 33 is a diagram showing a hysteresis loop in a conventional magnetoresistive element having a magnetic vortex structure.
Figure 34:
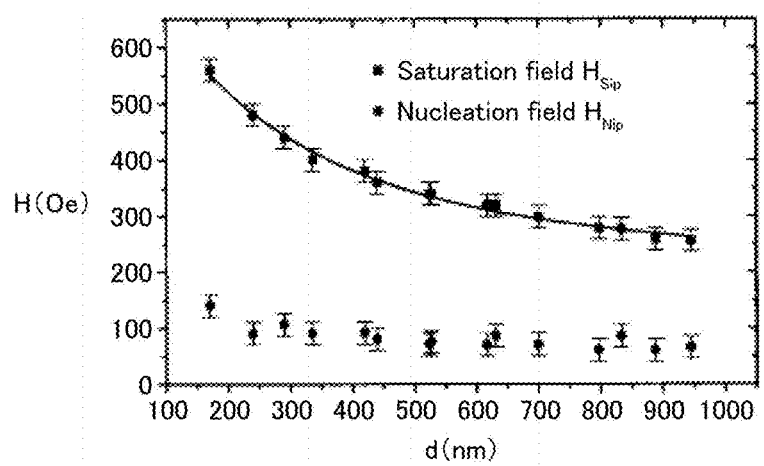
FIG. 34 is a diagram showing the disk diameter of the conventional magnetoresistive element having the magnetic vortex structure, and a saturation field and a nucleation field.
Figure 35:
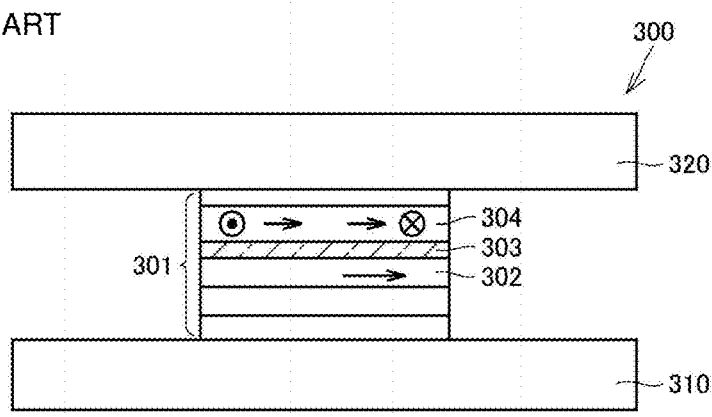
FIG. 35 is a schematic sectional view showing a magnetic sensor having incorporated therein the conventional magnetoresistive element having the magnetic vortex structure.
Figure 36:
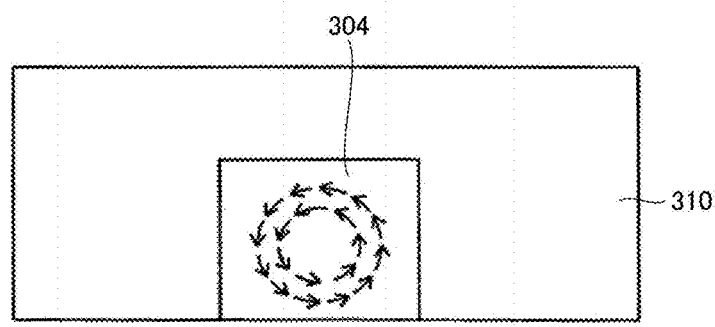
FIG. 36 is a schematic top view of the magnetic sensor of FIG. 35.
Figure 37:
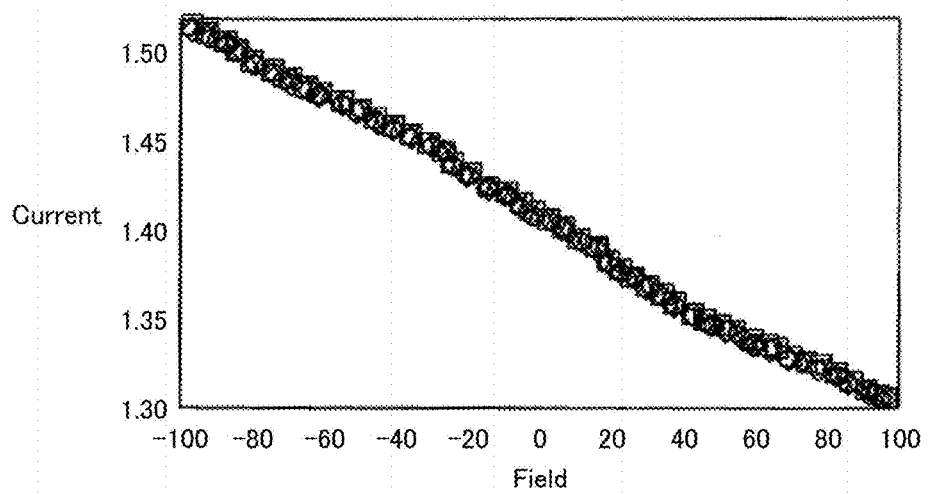
FIG. 37 is a diagram showing responsiveness of the magnetic sensor shown in FIG. 35.

In this case, the left side in FIG. 5 shows a case in which the external magnetic field is larger to a 180° direction (negative direction, specifically, 180° direction with respect to the DR1 direction in FIG. 1 and FIG. 17). The center in FIG. 5 shows a case in which no external magnetic field is applied. The right side in FIG. 5 shows a case in which the external magnetic field is larger to a 0° direction (positive direction, specifically, the DR1 direction in FIG. 1 and FIG. 17). Note that the states of vortical magnetization in FIG. 5 substantially correspond to the states of magnetic vortexes indicated at positions on a magnetization curve shown in FIG. 33.

As shown at the center in FIG. 5, when no external magnetic field is applied, the center of the magnetic vortex in the free layer 207 is positioned at the center of the free layer 207.

As shown at the second from the left in FIG. 5, when the external magnetic field is applied to a negative direction, the center of the magnetic vortex in the free layer 207 moves from the center of the free layer 207 downward in FIG. 5. Furthermore, when the external magnetic field to the negative direction increases, as shown at the first from the left in FIG. 5, the magnetic flux density of the free layer 207 is saturated, and magnetization of the free layer 207 becomes parallel or substantially parallel to the fixed orientation of magnetization of the reference layer 205.

As shown at the fourth from the left in FIG. 5, when the external magnetic field is applied to the positive direction, the center of the magnetic vortex in the free layer 207 moves from the center of the free layer 207 upward in FIG. 5. Furthermore, when the external magnetic field to the positive direction increases, as shown at the fifth from the left in FIG. 5, the magnetic flux density of the free layer 207 is saturated, and magnetization of the free layer 207 becomes antiparallel or substantially antiparallel to the fixed orientation of magnetization of the reference layer 105.

Figure 6:
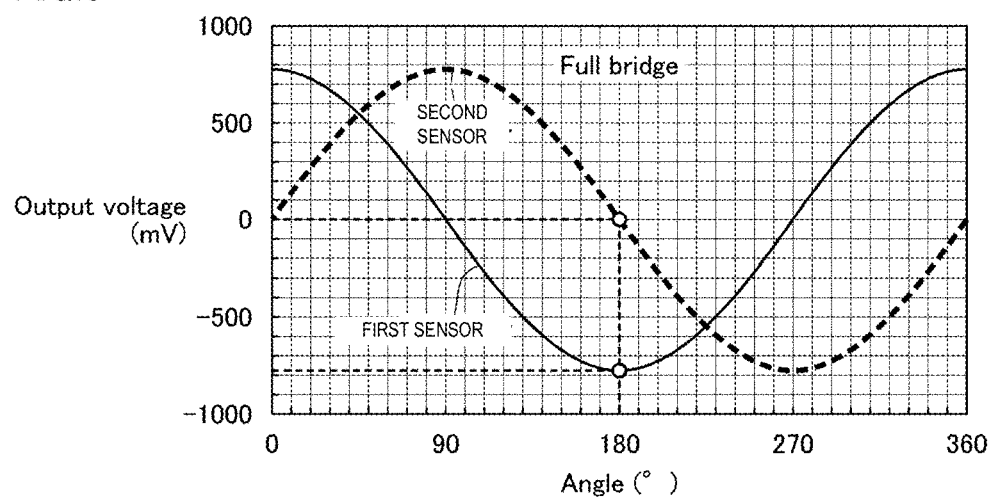
FIG. 6 is a diagram showing output characteristics in a first sensor and a second sensor included in an angle sensor according to the first preferred embodiment of the present invention with respect to the angle of the external magnetic field.

FIG. 6 is a diagram showing output characteristics in the first sensor and the second sensor included in the angle sensor according to the first preferred embodiment with respect to the angle of the external magnetic field. With reference to FIG. 6, the output characteristics of the first sensor 11 and the second sensor 12 with respect to the angle θ of the external magnetic field are described.

In the first sensor 11 configured as described above, the output characteristics with respect to the angle θ of the external magnetic field are represented by a cosine function. Also in the second sensor 12, the output characteristics with respect to the angle θ of the external magnetic field are represented by a cosine function. Note that in the second sensor 12, the magnetization direction of the lower ferromagnetic layer (reference layer) 105 is different by about 90° compared with the first sensor 11. Thus, the output characteristics of the second sensor 12 are in a state in which the phase is shifted by about 90° compared with the first sensor 11.

As described above, by acquiring outputs from the first sensor 11 and the second sensor 12 in a phase-shifted manner, the angle of the inputted external magnetic field can be uniquely defined with respect to the angles from 0° to 360°.

In this case, when an output in the first sensor 11 is denoted as Vout1 (mV), an output in the second sensor 12 is denoted as Vout2 (mV), and an angle between the direction of the external magnetic field and the reference direction (angle of the external magnetic field) is denoted as θ, the angle between the direction of the external magnetic field and the reference direction is calculated from Equation (1) below.

$$\theta = \tan^{-1}(Vout2/Vout1) \quad \text{Equation (1)}$$

By using this equation, the angle of the external magnetic field can be calculated.

Figure 7:
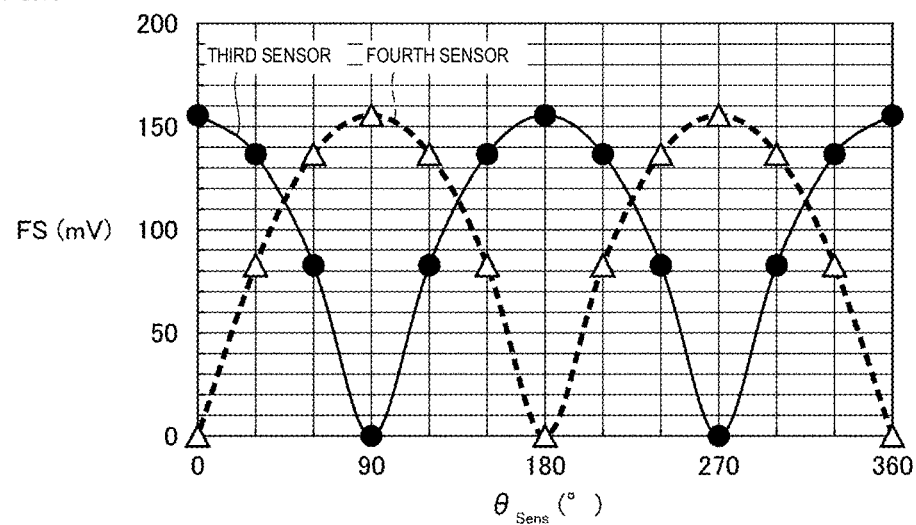
FIG. 7 is a diagram showing output full-scale characteristics in a third sensor and a fourth sensor included in a magnetic field strength sensor according to the first preferred embodiment of the present invention with respect to the angle of the external magnetic field.

FIG. 7 is a diagram showing output characteristics in the third sensor and the fourth sensor included in the magnetic field strength sensor according to the first preferred embodiment with respect to the angle of the external magnetic field. With reference to FIG. 7, the output characteristics of the third sensor and the fourth sensor 22 with respect to the angle of the external magnetic field are described.

In the fourth sensor 22, the magnetization direction of the lower ferromagnetic layer (reference layer) 205 is different by about 90° compared with the third sensor 21. With this, as shown in FIG. 7, the output from the fourth sensor 22 is higher at portions where the third sensor 21 output is smaller. Also, the output from the third sensor 21 is higher at portions where the output from the fourth sensor 22 is smaller. That is, by using the third sensor 21 and the fourth sensor 22 that are different from each other in the magnetization direction of the lower ferromagnetic layer 205, an area where the sensitivity of one sensor is low can be complemented by the other sensor.

Figure 8:
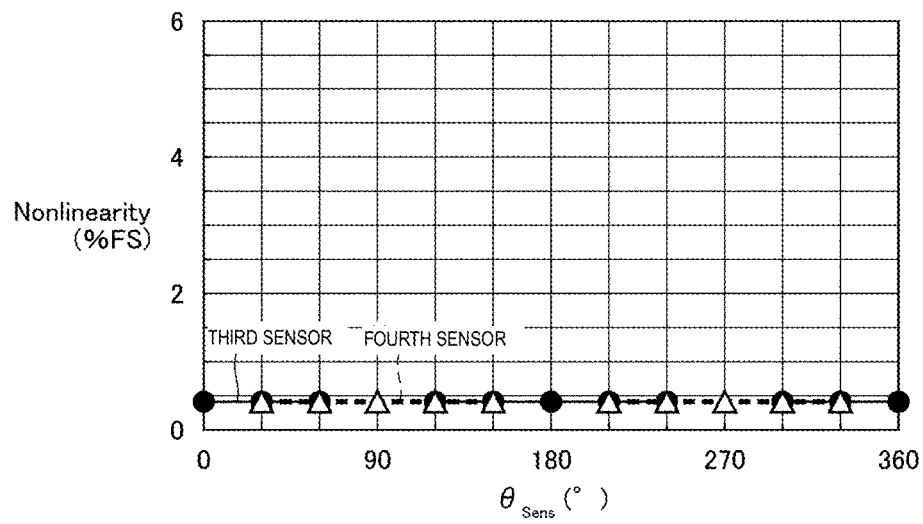
FIG. 8 is a diagram showing nonlinearity of outputs in the third sensor and the fourth sensor included in the magnetic field strength sensor according to the first preferred embodiment of the present invention with respect to the angle of the external magnetic field.

FIG. 8 is a diagram showing nonlinearity of outputs in the third sensor and the fourth sensor included in the magnetic field strength sensor according to the first preferred embodiment with respect to the angle of the external magnetic field. With reference to FIG. 8, nonlinearity of outputs from the third sensor and the fourth sensor 22 with respect to the angle of the external magnetic field is described.

As shown in FIG. 8, in a range with favorable sensitivity with respect to the angle of the external magnetic field, nonlinearity of outputs from the third sensor 21 and the fourth sensor 22 with respect to the angle of the external magnetic field is constant or substantially constant and is unchanged or substantially unchanged. Also, nonlinearity of outputs from the third sensor 21 and the fourth sensor 22 with respect to the angle of the external magnetic field is smaller than about 0.5% FS. Here, nonlinearity % FS (percent full scale) is defined as being expressed in percent by taking, at a certain external magnetic field angle, an output range of variation (full scale) in a measurement magnetic field range as a denominator and the amount of deviation of a measurement output with respect to an ideal line as a numerator.

Figure 9:
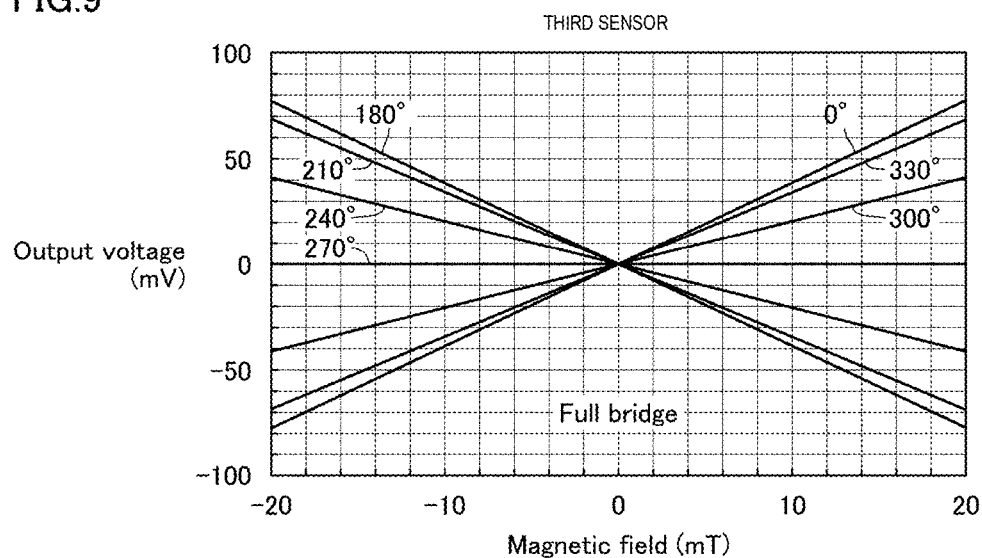
FIG. 9 is a diagram showing output characteristics in the third sensor included in the magnetic field strength sensor according to the first preferred embodiment of the present invention with respect to the magnetic field strength.

FIG. 9 is a diagram showing output characteristics in the third sensor included in the magnetic field strength sensor according to the first preferred embodiment with respect to the magnetic field strength. FIG. 9 shows, as one example, output characteristics in the third sensor 21 with respect to the magnetic field strength when the angle of the external magnetic field is 0°, 180°, 210°, 240°, 270°, 300°, and 330°.

The output characteristics in the third sensor 21 with respect to the magnetic field strength are represented by a straight or substantially straight line. Also, the output characteristics in the third sensor 21 with respect to the magnetic field strength vary in accordance with the angle of the external magnetic field.

Figure 10:
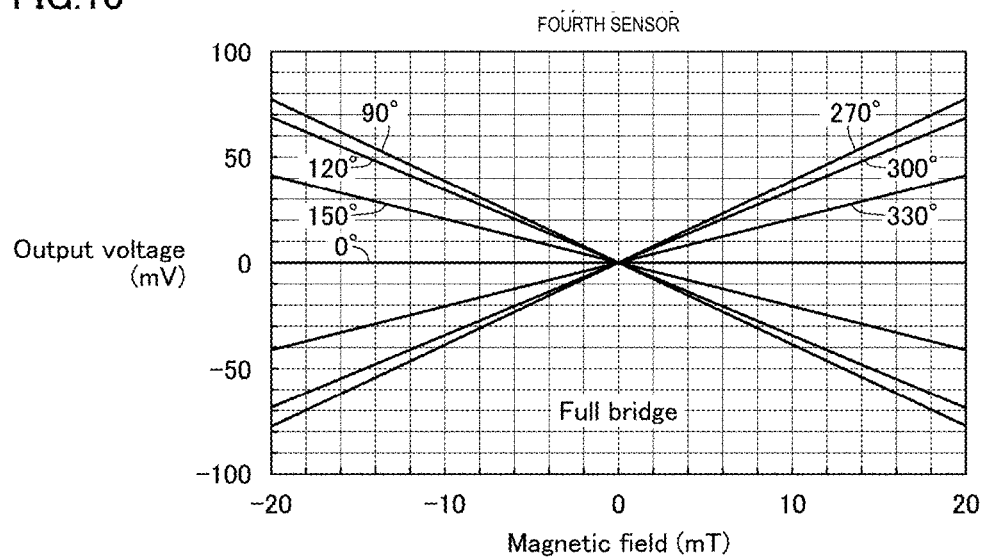
FIG. 10 is a diagram showing output characteristics in the fourth sensor included in the magnetic field strength sensor according to the first preferred embodiment of the present invention with respect to the magnetic field strength.

FIG. 10 is a diagram showing output characteristics in the fourth sensor included in the magnetic field strength sensor according to the first preferred embodiment with respect to the magnetic field strength. FIG. 10 shows, as one example, output characteristics in the fourth sensor 22 with respect to the magnetic field strength when the angle of the external magnetic field is 0°, 90°, 120°, 150°, 270°, 300°, and 330°.

The output characteristics in the fourth sensor 22 with respect to the magnetic field strength are represented by a straight or substantially straight line. Also, the output characteristics in the fourth sensor 22 with respect to the magnetic field strength vary in accordance with the angle of the external magnetic field.

As described above, with the third sensor 21 and the fourth sensor 22 having different output characteristics of sensitivity, the strength of the external magnetic field can be calculated based on the outputs from the third sensor 21 and the fourth sensor 22. Also, the strength of the external magnetic field can be calculated in a range of angles of the external magnetic field from 0° to 360°. For example, when the angle of the external magnetic field is 0°, even if the output from the fourth sensor 22 is 0, the strength of the external magnetic field can be calculated based on the output from the third sensor 21.

Specifically, when an output in the third sensor 21 is denoted as Vout3 (mV), an output in the fourth sensor 22 is denoted as Vout4 (mV), an angle between the direction of the external magnetic field and the reference direction is denoted as θ, a sensitivity of the third sensor where θ=0° is denoted as G3 (mV/mT), a sensitivity of the fourth sensor where θ=0° is denoted as G4 (mV/mT), a strength of the external magnetic field detected by the third sensor 21 is denoted as B3, and a strength of the external magnetic field detected by the fourth sensor 22 is denoted as B4, the strength of the external magnetic field is calculated from Equation (2) and Equation (3) below except θ=0°, 90°, 180°, 270°; the strength of the external magnetic field is calculated from Equation (2) when θ=0°, 180°; and the strength of the external magnetic field is calculated from Equation (3) when θ=90°, 270°.

$$B3 = V\text{out}3/G3 \cos\theta \quad \text{Equation (2)}$$

$$B4 = V\text{out}4/G4 \sin\theta \quad \text{Equation (3)}$$

By calculating the strength of the external magnetic field using these equations, the magnetic field strength can be easily determined.

The output characteristics of sensitivity of the third sensor 21 and the fourth sensor 22 in accordance with the angle are stored in a memory provided in the calculator 30. In the magnetic sensor 1, the angle of the external magnetic field is detected by the angle sensor 10 as described above and the output characteristics of sensitivity of the third sensor 21 and the fourth sensor 22 in accordance with the angle are selected based on the detected angle so as to correspond to that angle. With the selected output characteristics and the outputs from the third sensor 21 and the fourth sensor 22, the calculator 30 can determine the strength of the external magnetic field. As a result, in the magnetic sensor 1 according to the first preferred embodiment, the angle of the external magnetic field can be detected and, based on the detected angle, the strength of the external magnetic field can also be detected.

FIG. 11 to FIG. 16 respectively show a first process to a sixth process of a non-limiting example process of manufacturing the magnetic sensor according to the first preferred embodiment. With reference to FIG. 11 to FIG. 16, the method of manufacturing the magnetic sensor 1 according to the first preferred embodiment is described.

Figure 11:
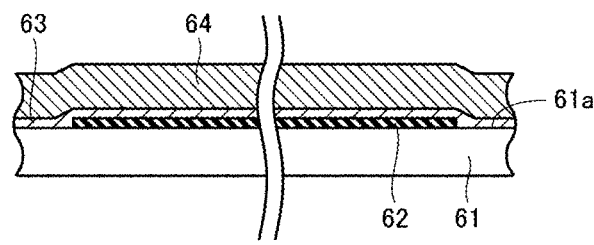
FIG. 11 is a diagram showing a first process of a process of manufacturing the magnetic sensor according to the first preferred embodiment of the present invention.

As shown in FIG. 11, in the first process in the method of manufacturing the magnetic sensor 1, by photolithography and dry etching and so forth, for example, a substrate 61 is prepared where an insulating layer 62 is formed in a formation area where a plurality of first magnetoresistive elements and a plurality of second magnetoresistive elements are to be formed. As the substrate 61, for example, a Si wafer can be used. The insulating layer 62 is, for example, a silicon oxide film.

Subsequently, an underlying film 63 is formed on a surface 61a of the substrate 61 so as to cover the insulating layer 62. As the underlying film 63, for example, Cu can be used.

Next, a TMR multilayer film 64 defining and functioning as a plurality of first magnetoresistive elements and a plurality of second magnetoresistive elements is formed on the underlying film 63.

Specifically, a lower electrode film, an anti-ferromagnetic formation film, a ferromagnetic film (film defining and functioning as a pinned layer), a non-magnetic film, a lower ferromagnetic film (film defining and functioning as a reference layer), an insulating film, an upper ferromagnetic film (film defining and functioning as a free layer), and a cap film are laminated, sequentially from an underlying film 63 side.

Note that after patterning the TMR multilayer film 64, the lower electrode film, the anti-ferromagnetic formation film, the ferromagnetic film, the non-magnetic film, the lower ferromagnetic film, the insulating film, the upper ferromagnetic film, and the cap film respectively become the lower electrode layer 101, 201, the anti-ferromagnetic layer 102, 202, the ferromagnetic layer 103, 203, the non-magnetic layer 104, 204, the lower ferromagnetic layer 105, 205, the insulating layer 106, 206, the upper ferromagnetic layer 107, 207, and the cap layer 108, 208.

Here, as a lower electrode film, for example, a Ru/Ta film is formed. As the ferromagnetic film/anti-ferromagnetic film, which are upper layers of the lower electrode film, for example, a CoFe/IrMn film is formed. With the occurrence of exchange coupling by annealing in the magnetic field, which will be described further below, this multilayer film functions a pinned layer.

As the non-magnetic film, which is an upper layer of the ferromagnetic film, for example, a Ru film is formed. As the lower ferromagnetic film, which is an upper layer of the non-magnetic film, for example, a CoFeB film is formed.

The lower ferromagnetic film/the non-magnetic film/the ferromagnetic film configure a SAF structure. By the lower ferromagnetic film, a reference layer with magnetization firmly fixed is formed.

As the insulating film, which is an upper layer of the lower ferromagnetic film, for example, a MgO film is formed. As the upper ferromagnetic film, which is an upper layer of the insulating film, for example, a CoFeB film is formed. Of the upper ferromagnetic film/MgO/the lower ferromagnetic film, by the upper ferromagnetic film, the upper ferromagnetic layer 107 as a free layer is formed and the upper ferromagnetic layer 207 as a free layer is formed. As the cap film, which is an upper layer of the upper ferromagnetic film, for example, Ta/Ru are laminated.

Subsequently, the substrate 61 with the TMR multilayer film 64 formed thereon is annealed in the magnetic field, and the direction of magnetization is fixed in the lower ferromagnetic film forming the lower ferromagnetic layer 105, 205 as a reference layer.

Specifically, the substrate 61 is locally annealed in the magnetic field so that a desired magnetization direction is obtained for each formation area of the first magnetoresistive elements defining a bridge circuit and for each formation area of the second magnetoresistive element defining a bridge circuit.

More specifically, in a bridge circuit, for each first magnetoresistive element formation area or for each second magnetoresistive element formation area, as shown in FIG. 1, while the magnetic field is applied so that the magnetization direction of the lower ferromagnetic layer 105, 205 is different by about 180°, annealing is performed by heating with local laser light application.

Between sensors, as shown in FIG. 1, while the magnetic field is applied so that the magnetization direction of the lower ferromagnetic layer 105, 205 is different by about 90°, annealing is performed by heating with local laser light application.

Figure 12:
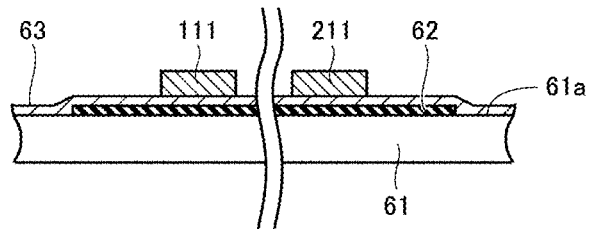
FIG. 12 is a diagram showing a second process of the process of manufacturing the magnetic sensor according to the first preferred embodiment of the present invention.

As shown in FIG. 12, in the second process in the method of manufacturing the magnetic sensor 1, by using photolithography and dry etching, for example, the TMR multilayer film is subjected to patterning into a desired shape. With this, a plurality of first magnetoresistive elements and a plurality of second magnetoresistive elements are formed. Note that in FIG. 12 to FIG. 16, the first magnetoresistive element 111 is shown as one example of the plurality of first magnetoresistive elements and the second magnetoresistive element 211 is shown as one example of the plurality of first magnetoresistive elements.

The plurality of first magnetoresistive elements and the plurality of second magnetoresistive elements are each formed in a disk shape (circular or substantially circular shape in plan view). Here, the disk diameter of each of the plurality of second magnetoresistive elements is smaller than the disk diameter of each of the plurality of first magnetoresistive elements. Specifically, the disk diameter of the second magnetoresistive element is set at, for example, approximately 500 nm, and the disk diameter of the first magnetoresistive element is set at, for example, approximately 2 μm.

Figure 13:
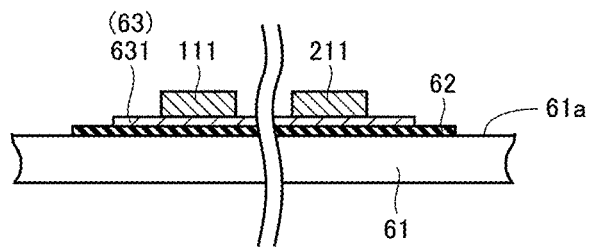
FIG. 13 is a diagram showing a third process of the process of manufacturing the magnetic sensor according to the first preferred embodiment of the present invention.

As shown in FIG. 13, in the third process in the method of manufacturing the magnetic sensor 1, by using photolithography and dry etching, for example, the underlying film 63 is subjected to patterning to form wire patterns 631 and 632.

Figure 14:
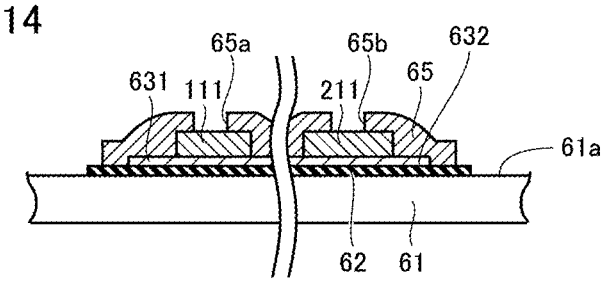
FIG. 14 is a diagram showing a fourth process of the process of manufacturing the magnetic sensor according to the first preferred embodiment of the present invention.

As shown in FIG. 14, in the fourth process in the method of manufacturing the magnetic sensor 1, an interlayer insulating film is formed on the entire or substantially the entire surface of the substrate 61. By using photolithography and dry etching, for example, the formed interlayer insulating film is subjected to patterning. With this, an interlayer insulating layer 65 is formed so as to cover the plurality of first magnetoresistive elements, the plurality of second magnetoresistive elements, and the wire patterns 631 and 632, and contact holes 65a and 65b are provided in the interlayer insulating layer 65.

Figure 15:
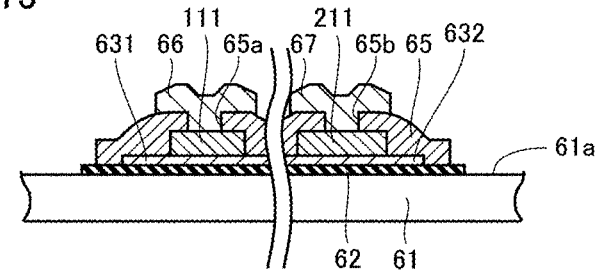
FIG. 15 is a diagram showing a fifth process of the process of manufacturing the magnetic sensor according to the first preferred embodiment of the present invention.

As shown in FIG. 15, in the fifth process in the method of manufacturing the magnetic sensor 1, by photolithography and liftoff, for example, a first wire 66 and a second wire 67 are formed. The first wire 66 and the second wire 67 are, for example, Cu wires.

The first wire 66 is connected to the first magnetoresistive element through the contact hole 65a. The second wire 67 is connected to the second magnetoresistive element through the contact hole 65b.

Figure 16:
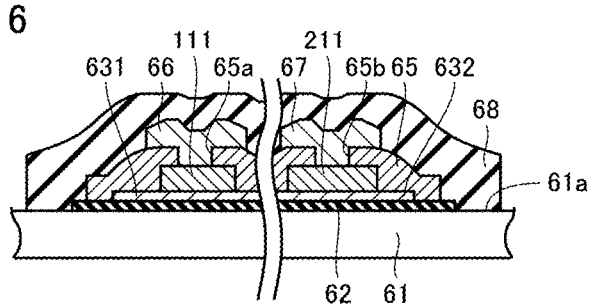
FIG. 16 is a diagram showing a sixth process of the process of manufacturing the magnetic sensor according to the first preferred embodiment of the present invention.

As shown in FIG. 16, in the sixth process in the method of manufacturing the magnetic sensor 1, a passivation film is formed on the entire or substantially the entire surface of the substrate 61. The passivation film is, for example, a $SiO_2$ film. By using photolithography and dry etching, for example, the passivation film is subjected to patterning, and a cavity is formed at a desired position.

The substrate 61 in which the angle sensor 10 and the magnetic field strength sensor 20 are formed in this manner is formed into a chip, which is mounted on a circuit substrate where the calculator 30 is formed, and thus the magnetic sensor 1 is manufactured. Note that the chip where the angle sensor 10 and the magnetic field strength sensor 20 are formed itself can be handled as the magnetic sensor 1.

When an external magnetic field with θ (angle)=180° and B (magnetic field)=10 mT was inputted to the magnetic sensor 1 manufactured as described above, it was confirmed that the angle of the external magnetic field can be determined by $\theta=\tan^{-1}$ (Vout2/Vout1) by using the output Vout1 from the first sensor 11 and the output Vout2 from the second sensor 12 in the angle sensor 10. Also, it was confirmed that, by using the output Vout3 from the third sensor 21 and the output Vout4 from the fourth sensor 22 in the magnetic field strength sensor 20, and sensitivity G3 (mV/mT) of the third sensor and sensitivity G4 (mV/mT) of the fourth sensor when θ=0°, the magnetic field strength can be determined by using equations of B3=Vout3/G3 cos θ and B4=Vout4/G4 sin θ.

Second Preferred Embodiment

Figure 18:
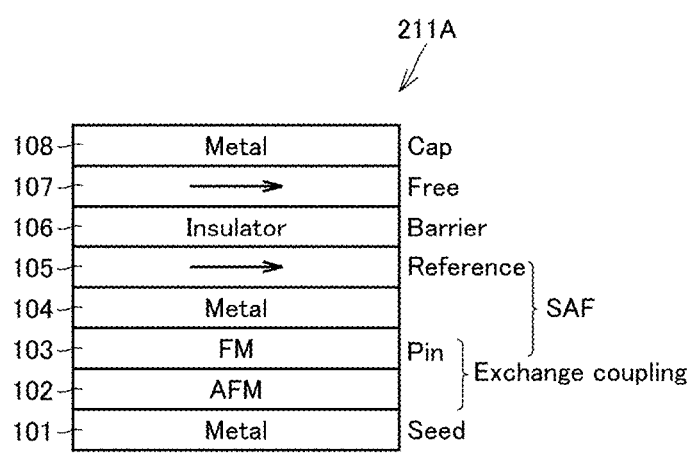
FIG. 18 is a schematic sectional view showing the structure of a second magnetoresistive element according to the second preferred embodiment of the present invention.

FIG. 17 is a schematic view showing a magnetic sensor according to a second preferred embodiment of the present invention. FIG. 18 is a schematic sectional view showing the structure of a second magnetoresistive element according to the second preferred embodiment. With reference to FIG. 17 and FIG. 18, a magnetic sensor 1A according to the second preferred embodiment is described.

As shown in FIG. 17 and FIG. 18, in the magnetic sensor 1A according to the second preferred embodiment, the structures of a plurality of second magnetoresistive elements 211A to 214A and 221A to 224A respectively included in the third sensor 21 and the fourth sensor 22 are different. The other structures are the same or substantially the same.

The second magnetoresistive elements 211A to 214A and 221A to 224A are each a tunnel connection element in which the magnetization structure of the free layer is not a magnetic vortex structure but a vertical magnetization structure. That is, compared with the first magnetoresistive elements 111 to 114 and 121 to 124, in the second magnetoresistive elements 211A to 214A and 221A to 224A, the direction of magnetization of the upper ferromagnetic layer 107 as a free layer is oriented in a direction vertical to the film surface when no external magnetic field is applied.

The second magnetoresistive element 211A includes the lower electrode layer 101, the anti-ferromagnetic layer 102, the ferromagnetic layer 103, the non-magnetic layer 104, the lower ferromagnetic layer 105, the insulating layer 106, an upper ferromagnetic layer 107A, and the cap layer 108.

The lower electrode layer 101, anti-ferromagnetic layer 102, ferromagnetic layer 103, non-magnetic layer 104, lower ferromagnetic layer 105, insulating layer 106, upper ferromagnetic layer 107A, and cap layer 108 are the same or substantially the same as those according to the first preferred embodiment. Note that the anti-ferromagnetic layer 102 is preferably made of an alloy including, for example, Mn such as IrMn.

Even when a magnetic field strength sensor 20A includes the second magnetoresistive elements 211A to 214A and 221A to 224A, the magnetic sensor 1 according to the second preferred embodiment has advantageous effects the same as or similar to those of the magnetic sensor 1 according to the first preferred embodiment.

Third Preferred Embodiment

Figure 19:
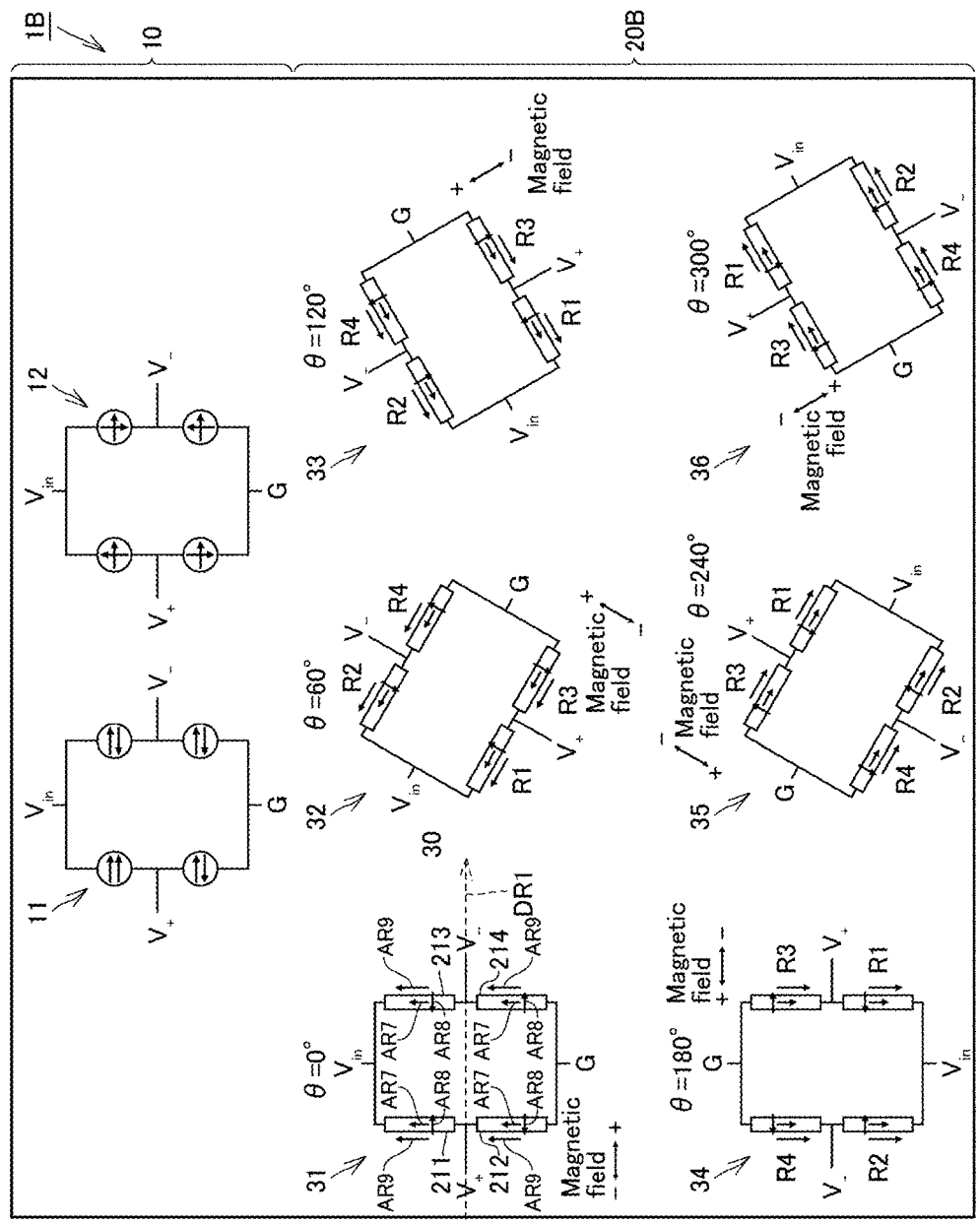
FIG. 19 is a schematic view showing a magnetic sensor according to a third preferred embodiment of the present invention.

FIG. 19 is a schematic view showing a magnetic sensor according to a third preferred embodiment of the present invention. With reference to FIG. 19, a magnetic sensor 1B according to the third preferred embodiment is described.

As shown in FIG. 19, the magnetic sensor 1B according to the third preferred embodiment is different in the structure of a magnetic field strength sensor 20B when compared with the magnetic sensor 1 according to the first preferred embodiment. The other structures are the same or substantially the same.

The magnetic field strength sensor 20B includes a plurality of sensors 31, 32, 33, 34, 35, and 36. The sensor 32, 33, 34, 35, and 36 are rotated.

The sensor 31 includes a plurality of second magnetoresistive elements 211B, 212B, 213B, and 214B. The plurality of second magnetoresistive elements 211B, 212B, 213B, and 214B define a full-bridge circuit.

The plurality of second magnetoresistive elements 211B, 212B, 213B, and 214B have a rectangular or substantially rectangular shape in plan view, with a direction perpendicular or substantially perpendicular to the reference direction DR1 direction being a longitudinal direction. The layer structure of the plurality of second magnetoresistive elements 211B, 212B, 213B, and 214B is the same or substantially the same as that of the plurality of first magnetoresistive elements 111, 112, 113, and 114 in the first preferred embodiment. A magnetization direction AR7 of the upper ferromagnetic layer 107 as a free layer is determined by a bias magnetic field AR9. A magnetization direction AR8 of the lower ferromagnetic layer 105 as a reference layer is in the same or substantially the same direction as that of the plurality of first magnetoresistive elements 111, 112, 113, and 114 in the first preferred embodiment.

When the output from the sensor 31 is linearized by using the bias magnetic field, if the direction of the input magnetic field is deviated from a bias direction, nonlinearity increases. Thus, to support various directions of the input magnetic field, a plurality of sensors with different bias directions are provided in the third preferred embodiment.

The sensor 32 is the sensor 31 rotated by about 60° counterclockwise.

The sensor 33 is the sensor 31 rotated by about 120° counterclockwise.

The sensor 34 is the sensor 31 rotated by about 180° counterclockwise.

The sensor 35 is the sensor 31 rotated by about 240° counterclockwise.

The sensor 36 is the sensor 31 rotated by about 300° counterclockwise.

Note that the plurality of sensors are not limited to the above-described six sensors and many sensors may be provided in accordance with the detected desired angle.

When the magnetic field strength sensor 20B is configured as described above, the strength of the external magnetic field is calculated from the output from the sensor corresponding to the angle detected by the angle sensor 10.

Even if configured as described above, the magnetic sensor 1B according to the third preferred embodiment can obtain advantageous effects the same as or similar to those of the magnetic sensor 1 according to the first preferred embodiment.

Fourth Preferred Embodiment

Figure 20:
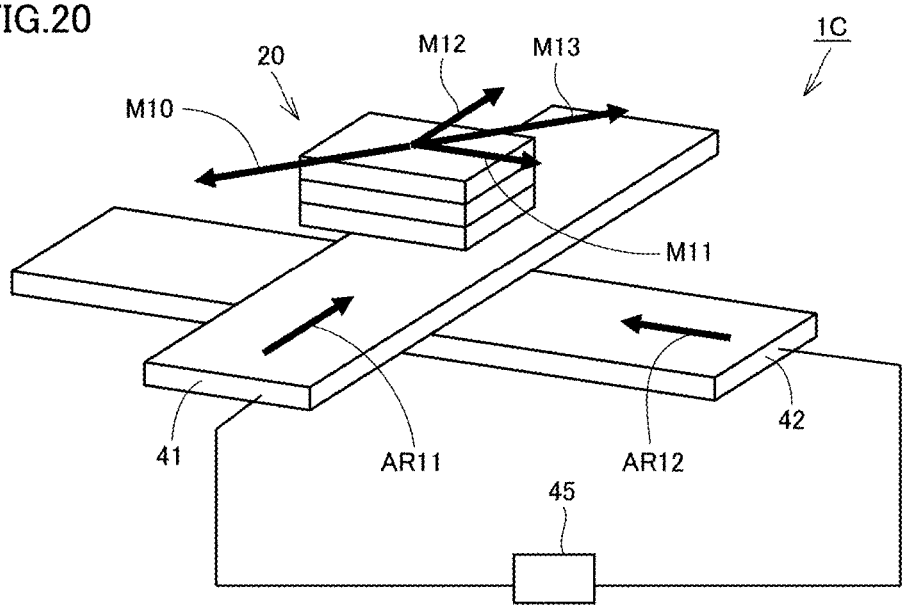
FIG. 20 is a schematic perspective view showing a magnetic sensor according to a fourth preferred embodiment of the present invention.
Figure 21:
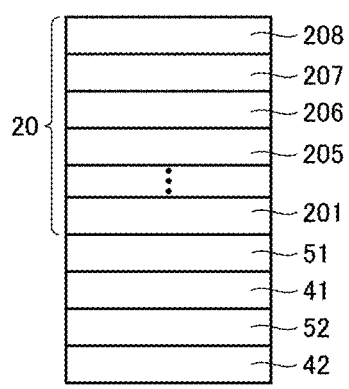
FIG. 21 is a schematic sectional view showing the magnetic sensor according to the fourth preferred embodiment of the present invention.

FIG. 20 is a schematic perspective view showing a magnetic sensor according to a fourth preferred embodiment of the present invention. FIG. 21 is a schematic sectional view showing the magnetic sensor according to the fourth preferred embodiment. In FIG. 20, for convenience, only a portion of the structure of the magnetic sensor is shown. With reference to FIG. 20 and FIG. 21, a magnetic sensor 1C according to the fourth preferred embodiment is described.

As shown in FIG. 20 and FIG. 21, compared with the magnetic sensor 1 according to the first preferred embodiment, the magnetic sensor 1C according to the fourth preferred embodiment is different in that it further includes a first cancel magnetic field generator 41, a second cancel magnetic field generator 42, and a current controller 45. The other structures are the same or substantially the same.

The second cancel magnetic field generator 42, the first cancel magnetic field generator 41, and the magnetic field strength sensor 20 are sequentially laminated. Between the second cancel magnetic field generator 42 and the first cancel magnetic field generator 41, a first insulating layer 51 is provided. Between the first cancel magnetic field generator 41 and the magnetic field strength sensor 20, a second insulating layer 52 is provided.

The first cancel magnetic field generator 41 and the second cancel magnetic field generator 42 are each a conductive member.

With a current flowing therethrough, the first cancel magnetic field generator 41 and the second cancel magnetic field generator 42 respectively generate a first cancel magnetic field M11 and a second cancel magnetic field M12 to cancel an external magnetic field M10. The external magnetic field M10 is canceled by a synthetic magnetic field of the first cancel magnetic field M11 and the second cancel magnetic field M12.

The first cancel magnetic field generator 41 extends in a direction parallel or substantially parallel to the magnetization direction fixed in the lower ferromagnetic layer (reference layer) of the fourth sensor 22 according to the first preferred embodiment. Through the first cancel magnetic field generator 41, for example, a current flows to a direction (AR11 direction) parallel or substantially parallel to the magnetization direction.

With this, the first cancel magnetic field generator 41 generates the first cancel magnetic field M11 in a direction parallel or substantially parallel to the magnetization direction of the lower ferromagnetic layer (reference layer) 205 in the third sensor 21 according to the first preferred embodiment.

The second cancel magnetic field generator 42 extends in a direction parallel or substantially parallel to the magnetization direction fixed in the lower ferromagnetic layer (reference layer) of the third sensor 21 according to the first preferred embodiment. Through the second cancel magnetic field generator 42, for example, a current flows to a direction (AR12 direction) parallel or substantially parallel to the above-described magnetization direction.

With this, the second cancel magnetic field generator 42 generates the second cancel magnetic field M12 to a direction parallel or substantially parallel to the magnetization direction of the lower ferromagnetic layer (reference layer) 205 in the fourth sensor 22 according to the first preferred embodiment.

The current controller 45 controls the current based on the angle between the direction of the external magnetic field and the reference direction detected by the angle sensor 10. Specifically, based on the detected angle information, the current controller 45 controls the amount of current so that the direction of the synthetic magnetic field is opposite to the direction of the external magnetic field. Furthermore, the current controller 45 controls the amount of current so that the synthetic magnetic field and the external magnetic field cancel out each other.

In the magnetic sensor 1C according to the fourth preferred embodiment, based on the amount of current flowing through the first cancel magnetic field generator 41 and the second cancel magnetic field generator 42, the strength of the external magnetic field is calculated, thus enabling an improvement in detection accuracy.

Also, by laminating the first cancel magnetic field generator 41, the second magnetic field cancel magnetic field generator 42, and the magnetic field strength sensor 20, the size of the magnetic sensor 1C can be reduced.

Fifth Preferred Embodiment

Figure 22:
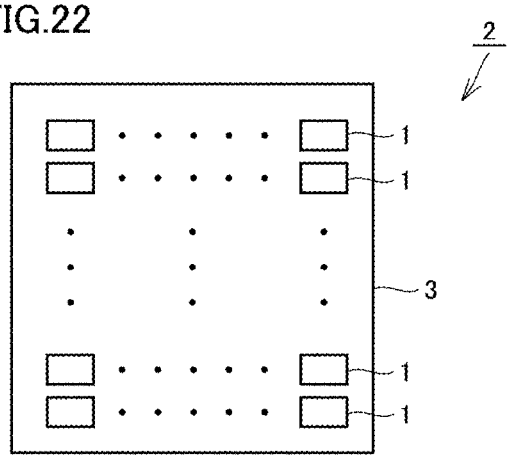
FIG. 22 is a schematic plan view showing a magnetic sensor array according to a fifth preferred embodiment of the present invention.
Figure 23:
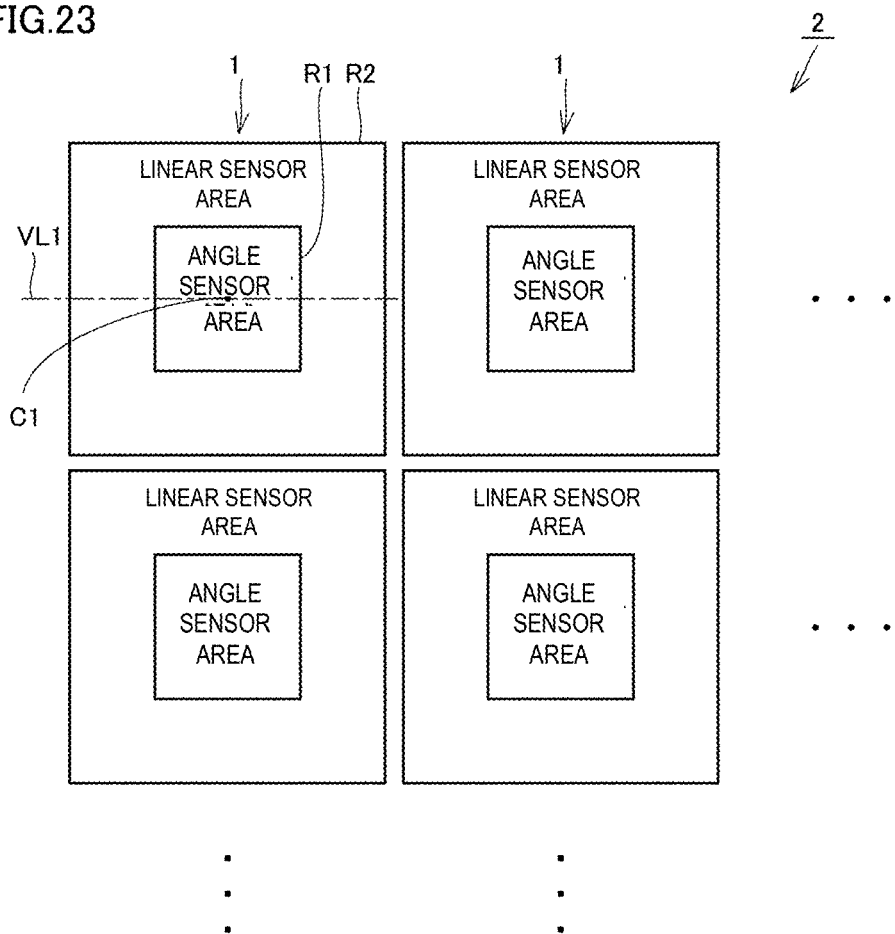
FIG. 23 is an enlarged view of the magnetic sensor array shown in FIG. 22.

FIG. 22 is a schematic plan view showing a magnetic sensor array according to a fifth preferred embodiment of the present invention. FIG. 23 is an enlarged view of the magnetic sensor array shown in FIG. 22. With reference to FIG. 22 and FIG. 23, a magnetic sensor array 2 according to the fifth preferred embodiment is described.

As shown in FIG. 22, the magnetic sensor array 2 includes a plurality of magnetic sensors 1 according to the first preferred embodiment. The plurality of magnetic sensors 1 are arranged in a matrix. The plurality of magnetic sensors 1 are provided on a base material 3.

As shown in FIG. 23, each magnetic sensor 1 includes a first area R1 and a second area R2 surrounding the periphery of the first area R1. In the first area R1, the angle sensor 10 is provided. In the second area R2, the magnetic field strength sensor 20 is provided. It has an axisymmetric shape with respect to a predetermined virtual line VL1 passing through a center C1 of the first area R1. Note that while the first area R1 and the second area R2 each have a quadrangular shape in the fifth preferred embodiment, this is not restrictive and the area may have, for example, a circular or substantially circular shape.

As described above, by providing the first area R1 and the second area R2 in an axisymmetric manner, the influence of the magnetic field distribution in the magnetic sensor 1 can be minimized. As a result, accuracy of detection of the angle and strength of the external magnetic field can be improved.

By using this magnetic sensor array 2, the angle and strength of the external magnetic field inputted from a magnetic field source to each magnetic sensor 1 can be calculated. This enables detection of an angular distribution and a strength distribution of the external magnetic field generated from the magnetic field source.

Note that while the case has been exemplarily described in the magnetic sensor array 2 according to the fifth preferred embodiment in which the plurality of magnetic sensors 1 are arranged in a planar manner, this is not restrictive and a plurality of magnetic sensors may be, for example, three-dimensionally arranged by providing a plurality of base materials 3 in a stacked manner.

Also, while the case has been exemplarily described in which the angle sensor 10 is provided in the first area R1 and the magnetic field strength sensor 20 is provided in the second area R2, this is not restrictive, and for example, the magnetic field strength sensor 20 may be provided in the first area R1 and the angle sensor 10 may be provided in the second area R2. That is, it is only required that one of the angle sensor 10 and the magnetic field strength sensor 20 is provided in the first area R1 and the other of the angle sensor 10 and the magnetic field strength sensor 20 is provided in the second area R2.

Sixth Preferred Embodiment

Figure 24:
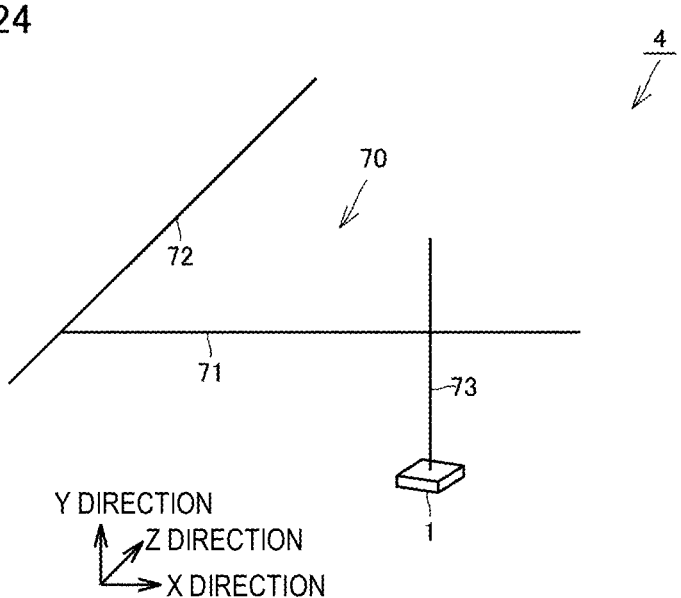
FIG. 24 is a diagram showing a magnetic field distribution measurement device according to a sixth preferred embodiment of the present invention.

FIG. 24 is a diagram showing a magnetic field distribution measurement device according to a sixth preferred embodiment of the present invention. With reference to FIG. 24, a magnetic field distribution measurement device 4 according to the sixth preferred embodiment is described.

As shown in FIG. 24, the magnetic field distribution measurement device 4 includes the magnetic sensor 1 according to the first preferred embodiment and a sensor movement mechanism 70. The sensor movement mechanism 70 is provided so as to be movable in at least any direction of an X-axis direction, a Y-axis direction, and a Z-axis direction. The sensor movement mechanism 70 includes an X-axis rail 71, a Y-axis rail 72, and a Z-axis rail 73.

The X-axis rail 71 extends to the X-axis direction. The X-axis rail 71 is provided so as to be movable in the Y-axis direction by the Y-axis rail 72. The X-axis rail 71 travels on the Y-axis rail 72 by a driving source such as, for example, a motor.

Note that the X-axis direction is any one direction in a horizontal direction and the Y-axis direction is a direction orthogonal or substantially orthogonal to the X-axis direction.

The Y-axis rail 72 extends along the Y-axis direction. The Y-axis rail 72 guides the movement of the X-axis rail 71 in the Y-axis direction. The Y-axis rail 72 is provided at one end of the X-axis rail 71 in the X-axis direction.

The Z-axis rail 73 extends along the Z-axis direction. The Z-axis direction is a vertical direction and is orthogonal or substantially orthogonal to the X-axis direction and the Y-axis direction. The Z-axis rail 73 is provided so as to be able to hold the magnetic sensor 1. The Z-axis rail 73 is provided so as to be movable in the Z-axis direction.

As described above, in the magnetic field distribution measurement device 4, by moving the magnetic sensor 1 by the sensor movement mechanism 70, the angle and strength of the external magnetic field inputted at each position to the magnetic sensor 1 from the magnetic field source can be calculated. This enables an angular distribution and a strength distribution of the external magnetic field generated from the magnetic field source to be detected. Also, since the angular distribution and the strength distribution of the external magnetic field can be detected by the single magnetic sensor 1, the resolving power to detect a magnetic field distribution can be improved.

Seventh Preferred Embodiment

Figure 25:
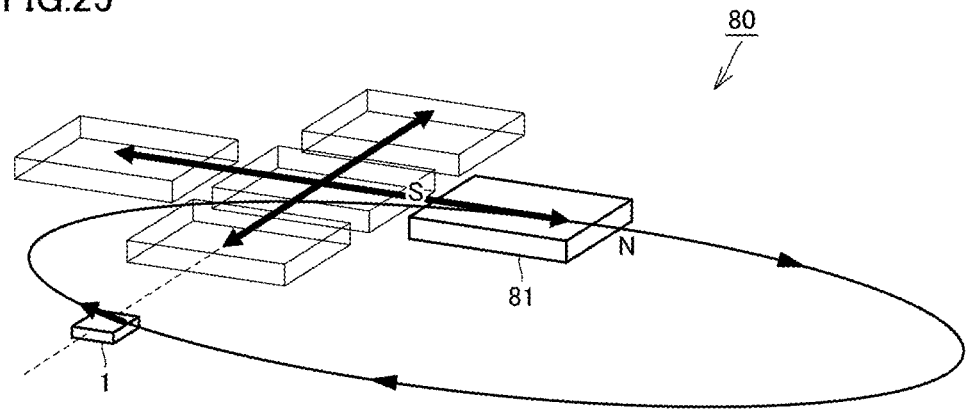
FIG. 25 is a diagram showing a position identification device according to a seventh preferred embodiment of the present invention.
Figure 26:
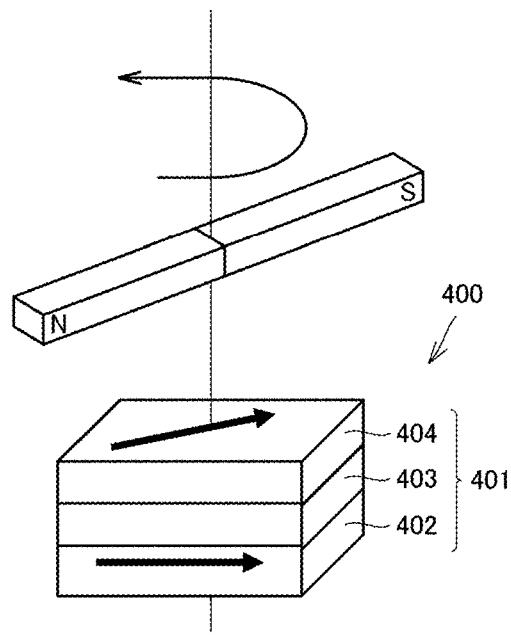
FIG. 26 is a schematic view showing a conventional first angle sensor.
Figure 27:
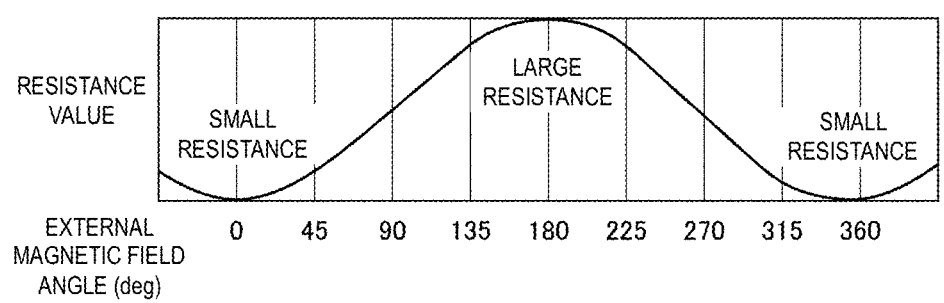
FIG. 27 is a diagram showing changes in resistance of a magnetoresistive element in the conventional first angle sensor.
Figure 28:
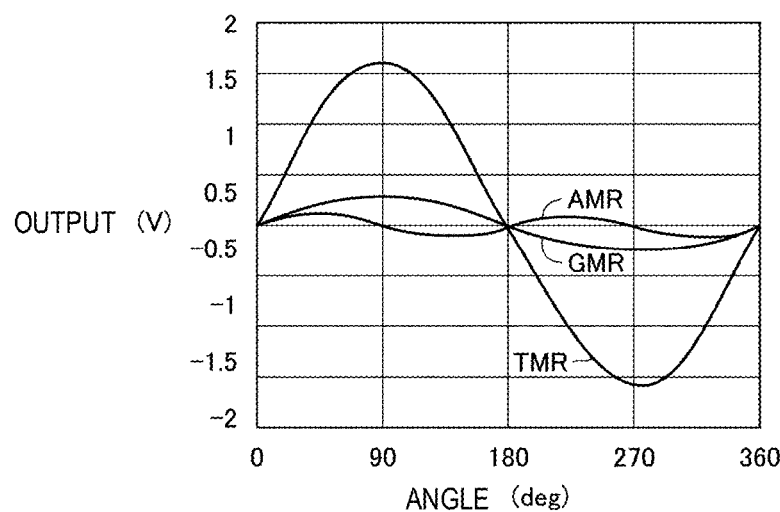
FIG. 28 is a diagram showing output characteristics of the conventional first angle sensor.
Figure 29:
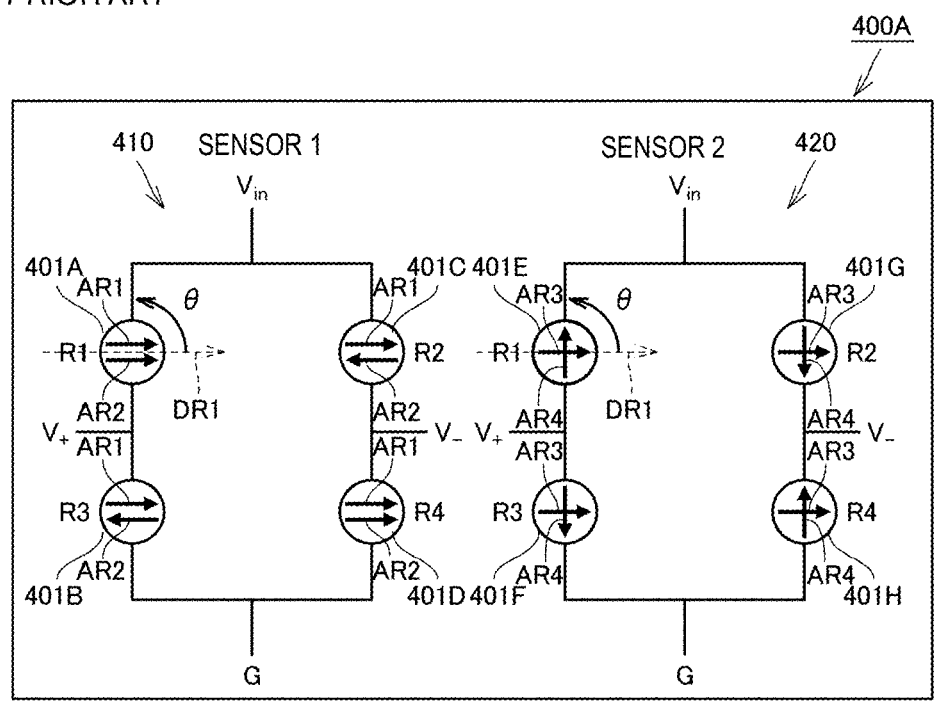
FIG. 29 is a schematic plan view showing a conventional second angle sensor.
Figure 30:
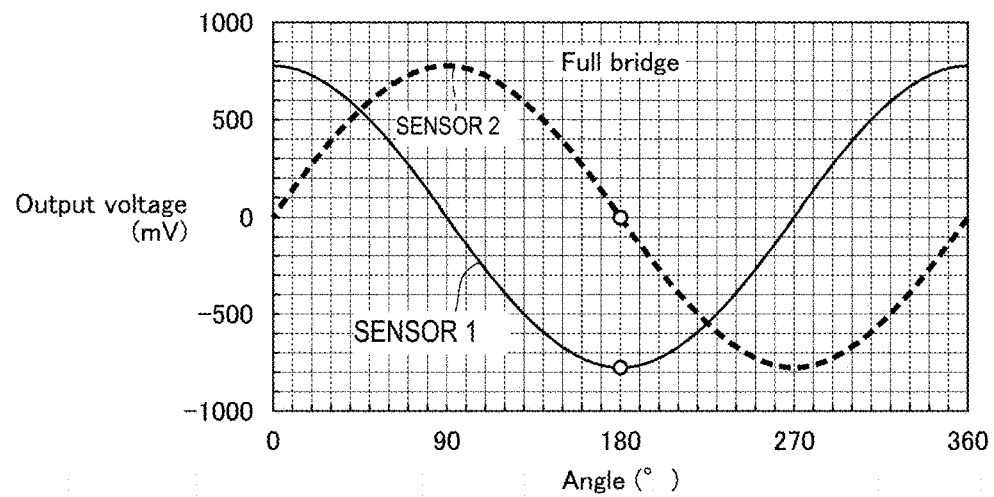
FIG. 30 is a diagram showing output characteristics of the conventional second angle sensor.
Figure 31:
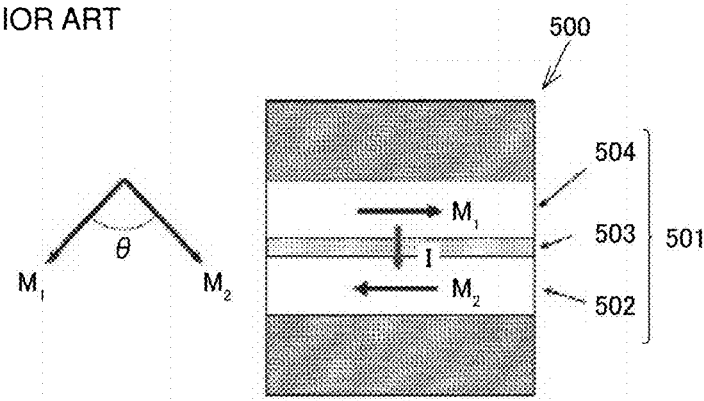
FIG. 31 is a schematic view showing the orientations of magnetization M1 of a free layer and magnetization M2 of a reference layer, these layers being arranged so as to interpose an insulating layer therebetween in a conventional magnetic tunnel junction element.
Figure 32:
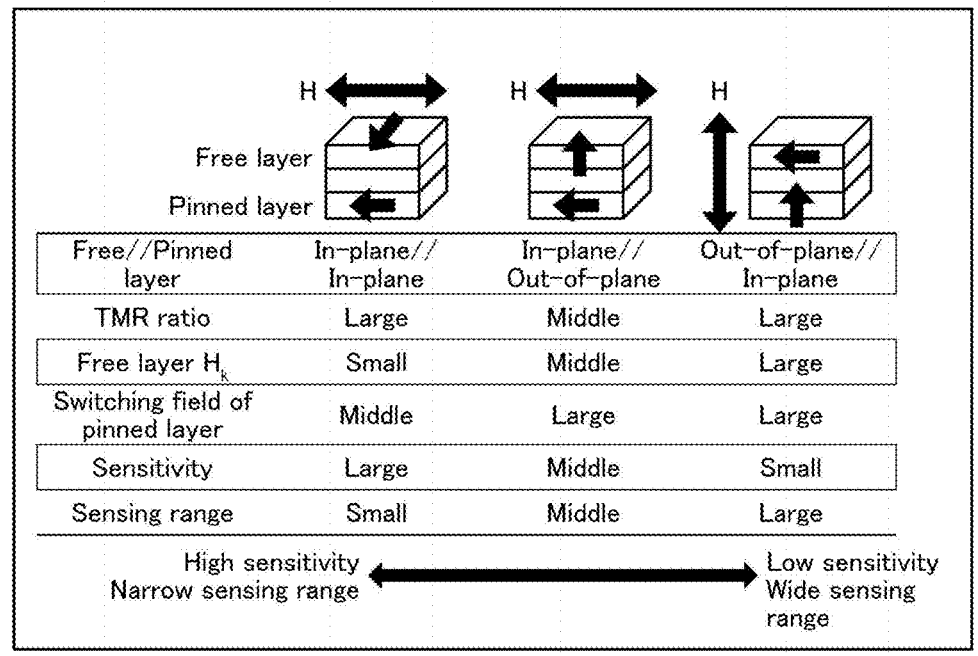
FIG. 32 is a diagram showing various conventional magnetoresistive elements and features of these magnetoresistive elements.

FIG. 25 is a diagram showing a position identification device according to a seventh preferred embodiment of the present invention. With reference to FIG. 25, a position identification device 80 according to the seventh preferred embodiment is described.

As shown in FIG. 25, the position identification device 80 according to the seventh preferred embodiment includes a movable body 81 and the magnetic sensor 1.

The movable body 81 is provided so as to be movable. In the seventh preferred embodiment, it is provided so as to be movable in a horizontal direction. The movable body 81 includes a magnetic field source. In accordance with the position of the movable body 81, the magnetic sensor 1 calculates an angle and strength of an external magnetic field generated from the magnetic field source. This enables the position of the movable body 81 to be identified.

This position identification device 80 can be incorporated in, for example, a camera module. In this case, the movable body 81 includes a magnetic field source such as a magnet, for example, and is a lens holder which holds a lens. By identifying the position of the lens holder, the position of the lens can be identified. Based on the identified position of the lens, focus can be controlled.

Note that while the case of using the magnetic sensor 1 according to the first preferred embodiment as a magnetic sensor is exemplarily described in the above-described fifth to seventh preferred embodiments, this is not restrictive, and the magnetic sensor according to any of the second to fourth preferred embodiments may be used.

Features of the respective preferred embodiments may be combined and/or substituted as appropriate, unless otherwise specified.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
   an angle sensor including a plurality of first magnetoresistive elements and producing an output based on an angle between a direction of an external magnetic field and a reference direction; and
   a magnetic field strength sensor including a plurality of second magnetoresistive elements and producing an output based on a strength of the external magnetic field; wherein
   the angle sensor and the magnetic field strength sensor mutually are arranged in a same or substantially a same direction of normal to a reference surface of sensor formation;
   the magnetic field strength sensor has different output characteristics in accordance with the angle between the direction of the external magnetic field and the reference direction; and
   based on the angle between the direction of the external magnetic field and the reference direction detected by the angle sensor and the output from the magnetic field strength sensor, the strength of the external magnetic field is determined.

2. The magnetic sensor according to claim 1, wherein the angle sensor and the magnetic field strength sensor are provided on a same substrate.

3. The magnetic sensor according to claim 1, wherein
   as output characteristics with respect to the angle between the direction of the external magnetic field and the reference direction, the angle sensor has output characteristics represented by a cosine function;
   as output characteristics with respect to the strength of the external magnetic field, the magnetic field strength sensor has output characteristics represented by a straight line; and
   a nonlinearity distribution with respect to the angle between the direction of the external magnetic field and the reference direction in the output characteristics of the magnetic field strength sensor is constant or substantially constant.

4. The magnetic sensor according to claim 1, wherein the plurality of first magnetoresistive elements and the plurality of second magnetoresistive elements each have a circular or substantially circular shape in plan view.

5. The magnetic sensor according to claim 1, wherein each of the plurality of second magnetoresistive elements includes a reference layer in which magnetization is fixed in a predetermined in-plane direction parallel or substantially parallel to a film surface and a free layer vortically magnetized about an axis perpendicular or substantially perpendicular to the film surface and in which a center of a vortex moves in accordance with the external magnetic field.

6. The magnetic sensor according to claim 1, wherein
   the angle sensor includes a first sensor and a second sensor having different output characteristics with respect to the angle between the direction of the external magnetic field and the reference direction;
   the first sensor and the second sensor each include the plurality of first magnetoresistive elements each including a reference layer in which a magnetization direction is fixed and a free layer in which a direction of magnetization changes in accordance with the direction of the external magnetic field; and
   the magnetization direction of the reference layer in the first sensor and the magnetization direction of the reference layer in the second sensor are different.

7. The magnetic sensor according to claim 6, wherein
   the magnetization direction of the reference layer in the first sensor and the magnetization direction of the reference layer in the second sensor are different by about 90';
   an output in the first sensor is denoted as Vout1 (mV), an output in the second sensor is denoted as Vout2 (mV), and the angle between the direction of the external magnetic field and the reference direction is denoted as θ; and
   the angle between the direction of the external magnetic field and the reference direction is calculated from an equation $\theta = \tan^{-1}(\text{Vout2}/\text{Vout1})$.

8. The magnetic sensor according to claim 1, wherein
   the magnetic field strength sensor includes a third sensor and a fourth sensor having different output characteristics with respect to the strength of the external magnetic field;
   the third sensor and the fourth sensor each include a reference layer in which magnetization is fixed in a predetermined in-plane direction parallel or substantially parallel to a film surface and a free layer vortically magnetized about an axis perpendicular or substantially perpendicular to the film surface and in which a center of a vortex moves in accordance with the external magnetic field; and a magnetization direction of the reference layer in the third sensor and a magnetization direction of the reference layer in the fourth sensor are different.

9. The magnetic sensor according to claim 8, wherein the magnetization direction of the reference layer in the third sensor and the magnetization direction of the reference layer in the fourth sensor are different by about 90°.

10. The magnetic sensor according to claim 9, wherein an output in the third sensor is denoted as Vout3 (mV), an output in the fourth sensor is denoted as Vout4 (mV)), the angle between the direction of the external magnetic field and the reference direction is denoted as θ, a sensitivity of the third sensor where θ=0° is denoted as G3 (mV/mT), a sensitivity of the fourth sensor where θ=0° is denoted as G4 (mV/mT), the strength of the external magnetic field detected by the third sensor is denoted as B3, and the strength of the external magnetic field detected by the fourth sensor is denoted as B4;

the strength of the external magnetic field is calculated from equations B3=Vout3/G3 cos θ and B4=Vout4/G4 sin θ, except when θ=0°, 90°, 180°, 270°;

the strength of the external magnetic field is calculated from the equation B3=Vout3/G3 cos θ when θ=0°, 180°; and the strength of the external magnetic field is calculated from the equation B4=Vout4/G4 sin θ when θ=90°, 270°.

11. The magnetic sensor according to claim 1, wherein the plurality of first magnetoresistive elements include one or more sets of paired first magnetoresistive elements defining a half-bridge circuit;

each of the one or more sets of paired first magnetoresistive elements includes a reference layer in which a magnetization direction is fixed and a free layer in which a direction of magnetization changes in accordance with the direction of the external magnetic field;

in the one or more sets of paired first magnetoresistive elements, the magnetization direction of the reference layer in one of the one or more sets of paired first magnetoresistive elements is opposite to the magnetization direction of the reference layer in another one of the one or more sets of paired first magnetoresistive elements;

the plurality of second magnetoresistive elements include one or more sets of paired second magnetoresistive elements configuring a half-bridge circuit, each of the one or more sets of paired second magnetoresistive elements includes a reference layer in which magnetization is fixed in a predetermined in-plane direction parallel or substantially parallel to a film surface and a free layer vortically magnetized about an axis perpendicular or substantially perpendicular to the film surface and in which a center of a vortex moves in accordance with the external magnetic field; and in the one or more sets of paired second magnetoresistive elements, a magnetization direction of the reference layer in one of the one or more sets of paired second magnetoresistive elements is opposite to a magnetization direction of the reference layer in another one of the one or more sets of paired second magnetoresistive elements.

12. The magnetic sensor according to claim 11, wherein the plurality of first magnetoresistive elements include a first group of the paired first magnetoresistive elements defining a first half-bridge circuit and a second group of the paired first magnetoresistive elements defining a second half-bridge circuit, a full-bridge circuit is defined by the first half-bridge circuit and the second half-bridge circuit;

a magnetization direction of the reference layer in one first magnetoresistive element of the first group of the paired first magnetoresistive elements defining the first half-bridge circuit and a magnetization direction of the reference layer in one first magnetoresistive element of the second group of the paired first magnetoresistive elements defining the second half-bridge circuit are oriented in a same or substantially a same direction;

the plurality of second magnetoresistive elements include a first group of the paired second magnetoresistive elements defining a third half-bridge circuit and a second group of the paired second magnetoresistive elements defining a fourth half-bridge circuit;

a full-bridge circuit is defined by the third half-bridge circuit and the fourth half-bridge circuit; and a magnetization direction of the reference layer in one second magnetoresistive element of the first group of the paired second magnetoresistive elements defining the third half-bridge circuit and a magnetization direction of the reference layer in one second magnetoresistive element of the second group of the paired second magnetoresistive elements defining the fourth half-bridge circuit are oriented a same or substantially a same direction.

13. The magnetic sensor according to claim 1, wherein each of the plurality of first magnetoresistive elements includes a reference layer in which magnetization is fixed in a predetermined in-plane direction parallel or substantially parallel to a film surface and a free layer vortically magnetized about an axis perpendicular or substantially perpendicular to the film surface and in which a center of a vortex moves in accordance with the external magnetic field.

14. The magnetic sensor according to claim 1, further comprising:

a first cancel magnetic field generator and a second cancel magnetic field generator generating a cancel magnetic field to cancel the external magnetic field provided to the magnetic field strength sensor; and a current controller to control a current flowing through the first cancel magnetic field generator and the second cancel magnetic field generator; wherein the current controller controls the current based on the angle between the direction of the external magnetic field and the reference direction detected by the angle sensor.

15. The magnetic sensor according to claim 14, wherein the magnetic field strength sensor includes a third sensor and a fourth sensor having different output characteristics with respect to the strength of the external magnetic field;

the third sensor and the fourth sensor each include a reference layer in which magnetization is fixed in a predetermined in-plane direction parallel or substantially parallel to a film surface and a free layer vortically magnetized about an axis perpendicular or substantially perpendicular to the film surface and in which a center of a vortex moves in accordance with the external magnetic field;

a magnetization direction of the reference layer in the third sensor and a magnetization direction of the reference layer in the fourth sensor are different;

the external magnetic field is canceled by a synthetic magnetic field of a first cancel magnetic field generated by the first cancel magnetic field generator and a second cancel magnetic field generated by the second cancel magnetic field generator;

a direction of the first cancel magnetic field is parallel or substantially parallel to the magnetization direction of the reference layer in the third sensor; and a direction of the second cancel magnetic field is parallel or substantially parallel to the magnetization direction of the reference layer in the fourth sensor.

16. The magnetic sensor according to claim 14, wherein the second cancel magnetic field generator, the first cancel magnetic field generator, and the magnetic field strength sensor are sequentially laminated;

a first insulating layer is provided between the second cancel magnetic field generator and the first cancel magnetic field generator; and a second insulating layer is provided between the first cancel magnetic field generator and the magnetic field strength sensor.

17. A magnetic sensor array comprising:

plurality of the magnetic sensors according to claim 1; wherein the plurality of the magnetic sensors are arranged in a matrix.

18. The magnetic sensor array according to claim 17, wherein the magnetic sensor includes a first area and a second area surrounding a periphery of the first area;

one of the angle sensor and the magnetic field strength sensor is provided in the first area;

another one of the angle sensor and the magnetic field strength sensor is provided in the second area; and the first area and the second area have an axisymmetric shape with respect to a virtual line passing through a center of the first area.

19. A magnetic field distribution measurement device comprising:

the magnetic sensor according to claim 1; and a sensor movement mechanism to move the magnetic sensor in at least one of an X-axis direction, a Y-axis direction, and a Z-axis direction.

20. A position identification device comprising:

the magnetic sensor according to claim 1; and a movable body including a magnetic field source.

* * * * *